us009029951B2

(12) United States Patent
Horita et al.

(10) Patent No.: US 9,029,951 B2
(45) Date of Patent: May 12, 2015

(54) SEMICONDUCTOR DEVICE HAVING WELL REGIONS WITH OPPOSITE CONDUCTIVITY

(75) Inventors: Katsuyuki Horita, Kanagawa (JP); Toshiaki Iwamatsu, Kanagawa (JP); Hideki Makiyama, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 145 days.

(21) Appl. No.: 13/555,184

(22) Filed: Jul. 22, 2012

(65) Prior Publication Data
US 2013/0020644 A1 Jan. 24, 2013

(30) Foreign Application Priority Data
Jul. 22, 2011 (JP) .................... 2011-161009

(51) Int. Cl.
| | |
|---|---|
| H01L 27/12 | (2006.01) |
| H01L 21/265 | (2006.01) |
| H01L 21/84 | (2006.01) |
| H01L 27/02 | (2006.01) |
| H01L 27/11 | (2006.01) |
| G11C 11/412 | (2006.01) |
| H01L 29/786 | (2006.01) |
| H01L 21/74 | (2006.01) |

(52) U.S. Cl.
CPC ............ H01L 21/2652 (2013.01); H01L 21/84 (2013.01); H01L 27/0207 (2013.01); H01L 27/1108 (2013.01); H01L 27/1203 (2013.01); G11C 11/412 (2013.01); H01L 29/78648 (2013.01); H01L 21/743 (2013.01)

(58) Field of Classification Search
CPC .... H01L 27/11; H01L 27/1104; H01L 27/105
USPC ............ 257/347, 351, 368, 350, E27.06, 257/E29.255, E27.112, E27.114, E21.661; 438/217, 151, 458
See application file for complete search history.

(56) References Cited

U.S. PATENT DOCUMENTS 6,486,751 B1 11/2002 Barber et al.
(Continued)

FOREIGN PATENT DOCUMENTS

| JP | 2002-175081 A | 6/2002 |
|---|---|---|
| JP | 2006004974 A | 1/2006 |
| JP | 2007042730 A | 2/2007 |

(Continued)

OTHER PUBLICATIONS

Office Action dated Oct. 28, 2014 for corresponding Japanese Patent Application No. 2011-161009 with English translation.

*Primary Examiner* — Matthew Gordon
(74) *Attorney, Agent, or Firm* — Miles & Stockbridge P.C.

(57) ABSTRACT

A semiconductor device with an SRAM memory cell having improved characteristics. Below an active region in which a driver transistor including a SRAM is placed, an n type back gate region surrounded by an element isolation region is provided via an insulating layer. It is coupled to the gate electrode of the driver transistor. A p well region is provided below the n type back gate region and at least partially extends to a position deeper than the element isolation region. It is fixed at a grounding potential. Such a configuration makes it possible to control the threshold potential of the transistor to be high when the transistor is ON and to be low when the transistor is OFF; and control so as not to apply a forward bias to the PN junction between the p well region and the n type back gate region.

18 Claims, 37 Drawing Sheets

(56) References Cited

U.S. PATENT DOCUMENTS

| | | |
|---|---|---|
| 7,498,637 B2 | 3/2009 | Yamaoka et al. |
| 7,732,864 B2 | 6/2010 | Kawahara et al. |
| 2009/0134468 A1* | 5/2009 | Tsuchiya et al. ............. 257/368 |
| 2012/0018807 A1 | 1/2012 | Tsuchiya et al. |

FOREIGN PATENT DOCUMENTS

| | | |
|---|---|---|
| JP | 2009520346 A | 5/2009 |
| JP | 2009135140 A | 6/2009 |
| WO | 2007071468 A1 | 6/2007 |
| WO | WO 2010/082504 A1 | 7/2010 |

* cited by examiner

|  | on | off |
|---|---|---|
| G | Vdd | O(VSS) |
| nBG | Vdd | O(VSS) |
| Pwell | VSS | VSS |

|  | on | off |
|---|---|---|
| G | 0(VSS) | Vdd |
| pBG | 0(VSS) | Vdd |
| Nwell | Vdd | Vdd |

| | on |
|---|---|
| G | Vdd + α |
| nBG | O(VSS) |
| Pwell | VSS |

SEMICONDUCTOR DEVICE HAVING WELL REGIONS WITH OPPOSITE CONDUCTIVITY

CROSS-REFERENCE TO RELATED APPLICATIONS

The disclosure of Japanese Patent Application No. 2011-161009 filed on Jul. 22, 2011 including the specification, drawings and abstract is incorporated herein by reference in its entirety.

BACKGROUND

The present invention relates to a semiconductor device, in particular, to a technology effective when applied to a semiconductor device having CMOS or SRAM on an SOI substrate.

SRAM (Static Random Access Memory) is a kind of semiconductor memories and it stores data by using flip flop. For example, in SRAM, data ("1" or "0") is stored in two cross-coupled CMOS inverters comprised of four transistors. In addition, it needs two transistors for read and write accesses so that in a typical SRAM, a memory cell has six transistors. CMOS is an abbreviation of Complementary MOS (Metal Oxide Semiconductor).

For example, Patent Document (International Patent Publication WO/2010/082504) discloses a technology of reducing an element area of an SOI-MISFET excellent in low power consumption and high speed operation. Described specifically, according to the technology disclosed in this document, an N conductivity type MISFET region and a P conductivity type MISFET region in an SOI type MISFET are formed to share a diffusion layer region and respective well-region diffusion layers of the N conductivity type MISFET region and the P conductivity type MISFET region which apply a substrate potential thereto are isolated from each other by an STI layer. For example, it is disclosed that threshold voltage control diffusion layer regions (25) and (26) shown in FIG. 15 and paragraph [0037] are electrically coupled to an outside line, for example, power source supply line. The number in the parentheses shows the reference number described in the above document.

[Patent Document 1] International Patent Publication WO/2010/082504

SUMMARY

For example, as described in Patent Document 1 (FIG. 1, etc.), use of an SOI (Silicon On Insulator) substrate has been studied in order to obtain LSI having high performance such as low power consumption and higher speed operation.

In addition, as will be described later in detail, the threshold value of a transistor is controlled by using an SOI substrate for CMOS to include a so-called double gate structure.

In employing the double-gate structure, it can be practically used for a single CMOS, but it is difficult to use it for a memory having many transistors. In addition, when the double gate structure is used for the control of a substrate potential, a leakage current becomes a problem due to forward bias of a PN junction.

An object of the invention is to provide a semiconductor device having excellent characteristics, in particular, to provide a CMOS semiconductor device having improved characteristics and also provide a semiconductor device with a SRAM memory cell having improved characteristics.

The above-described object and another object, and novel features of the invention will be apparent from the description herein and accompanying drawings.

Of the inventions disclosed herein, a semiconductor device according to a typical embodiment has the following (a1) to (e2). (a1) is a first transistor coupled between a first potential and a first node. (a2) is a second transistor coupled between the first node and a second potential lower than the first potential. (a3) is a third transistor coupled between the first potential and a second node. (a4) is a fourth transistor coupled between the second node and the second potential. (b1) is a first active region which is surrounded by an element isolation region and in which the first transistor is placed. (b2) is a second active region which is surrounded by the element isolation region and in which the second transistor is placed. (c) is an insulating layer placed below the first active region and the second active region. (d1) is a first semiconductor region placed below the first active region via the insulating layer and surrounded by the element isolation region. (d2) is a second semiconductor region placed below the second active region via the insulating layer and surrounded by the element isolation region. (e1) is a third semiconductor region placed below the first semiconductor region and at least partially extending to a position deeper than the element isolation region. (e2) is a fourth semiconductor region placed below the second semiconductor region and at least partially extending to a position deeper than the element isolation region. The first semiconductor region is coupled to the gate electrode of the first transistor; the second semiconductor region is coupled to the gate electrode of the second transistor; the third semiconductor region is a region having a conductivity type opposite to that of the first semiconductor region and coupled to the first potential; and the fourth semiconductor region is a region having a conductivity type opposite to that of the second semiconductor region and coupled to the second potential.

Of the inventions disclosed herein, a semiconductor device according to another typical embodiment has the following (a1) to (e2). (a1) is a first transistor coupled between a first potential and a first node. (a2) is a second transistor coupled between the first node and a second potential lower than the first potential. (a3) is a third transistor coupled between the first potential and a second node. (a4) is a fourth transistor coupled between the second node and the second potential. (b1) is a first active region which is surrounded by an element isolation region and in which the first transistor is placed. (b2) is a second active region which is surrounded by the element isolation region and in which the second transistor is placed. (c) is an insulating layer placed below the first active region and the second active region. (d1) is a first semiconductor region placed below the first active region via the insulating layer and surrounded by the element isolation region. (d2) is a second semiconductor region placed below the second active region via the insulating layer and surrounded by the element isolation region. (e1) is a third semiconductor region placed below the first semiconductor region and at least partially extending to a position deeper than the element isolation region. (e2) is a fourth semiconductor region placed below the second semiconductor region and at least partially extending to a position deeper than the element isolation region. The first semiconductor region is coupled to the gate electrode of the first transistor; the second semiconductor region is coupled to the gate electrode of the second transistor; the third semiconductor region is a region having a conductivity type opposite to that of the first semiconductor region and coupled to the second potential; and the fourth semiconductor region is a region having a conductivity type opposite to that of the second semiconductor region and coupled to the first potential.

Of the inventions disclosed herein, a semiconductor device according to a further typical embodiment has the following (a) to (c). (a) is an n channel transistor placed in an active region surrounded by an element isolation region. (b) is a first semiconductor region placed below active region via the insulating layer and surrounded by the element isolation region. (c) is a second semiconductor region placed below the first semiconductor region and at least partially extending to a position deeper than the element isolation region. The first semiconductor region is coupled to the gate electrode of the n channel transistor, and the second semiconductor region is of a conductivity type opposite to that of the first semiconductor region.

Of the inventions disclosed herein, a semiconductor device according to a still further typical embodiment has the following (a) to (c). (a) is a p channel transistor placed in an active region surrounded by an element isolation region. (b) is a first semiconductor region placed below active region via the insulating layer and surrounded by the element isolation region. (c) is a second semiconductor region placed below the first semiconductor region and at least partially extending to a position deeper than the element isolation region. The first semiconductor region is coupled to the gate electrode of the p channel transistor, and the second semiconductor region is of a conductivity type opposite to that of the first semiconductor region.

Of the inventions disclosed herein, the semiconductor devices according to the following typical embodiments can have improved characteristics.

DETAILED DESCRIPTION

Figure 1:
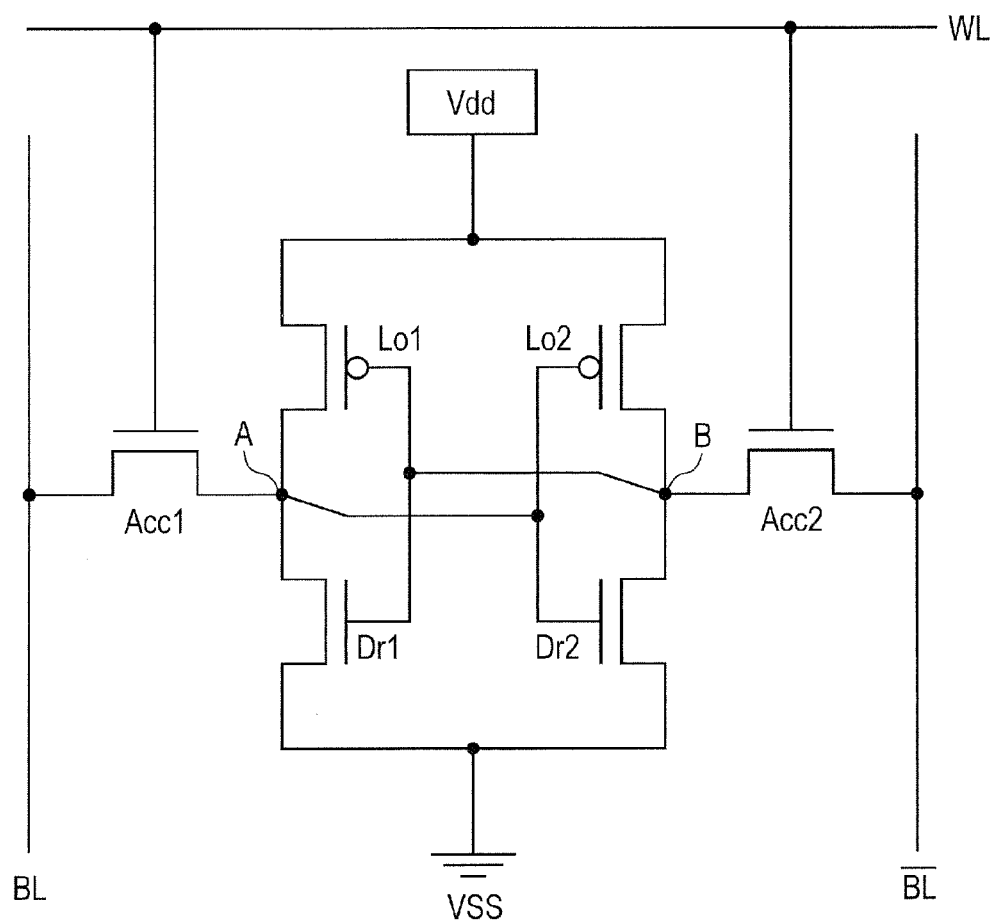
FIG. 1 is an equivalent circuit diagram showing a SRAM memory cell according to the first embodiment.

In the below-described embodiments, a description will be made after they are divided in plural sections or in plural embodiments if necessary for convenience's sake. These plural sections or embodiments are not independent each other, but in a relation such that one is a modification example, an application example, details, or complementary description of a part or whole of the other one unless otherwise specifically indicated. In the below-described embodiments, when a reference is made to the number of elements (including the number, value, amount, and range), the number of elements is not limited to a specific number but can be greater than or less than the specific number unless otherwise specifically indicated or principally apparent that the number is limited to the specific number.

Moreover in the below-described embodiments, it is needless to say that the constituent elements (including element steps) are not always essential unless otherwise specifically indicated or principally apparent that they are essential. Similarly, in the below-described embodiments, when a reference is made to the shape, positional relationship, or the like of the constituent elements, that substantially analogous or similar to it is also embraced unless otherwise specifically indicated or different in principle. This also applies to the above-described number (including the number, value, amount, and range).

The embodiments of the invention will hereinafter be described in detail based on drawings. In all the drawings for describing the below-described embodiments, members having like function will be identified by like or relevant reference numerals and overlapping descriptions will be omitted. When there are two or more members (sites) similar to each other, a symbol may be added to the reference numeral to show an individual or specific site. In the following embodiments, any description on the same or like portions will not be repeated in principle unless otherwise particularly necessary.

In the drawings used in the embodiments, even cross-sectional views are sometimes not hatched in order to facilitate viewing of them. On the other hand, even plan views are sometimes hatched to facilitate viewing of them.

First Embodiment

Circuit Configuration

The semiconductor device (semiconductor integrated circuit device, semiconductor memory device) of the present embodiment has a SRAM memory cell. FIG. 1 is an equivalent circuit diagram showing the SRAM memory cell of the present embodiment. As shown in this diagram, the memory cell is placed at an intersection between a pair of a bit lines (bit line BL and bit line /BL or (bar)BL) and a word line WL. This memory cell has a pair of load transistors (load MOSs, load transistors, load MISFETs) Lo1 and Lo2, a pair of access transistors (access MOSs, access transistors, access MISFETs, transfer transistors) Acc1 and Acc2, and a pair of driver transistors (driver MOSs, driver transistors, driver MISFETs) Dr1 and Dr2.

Of the six transistors including the memory cell, the load transistors (Lo1 and Lo2) are p type (p channel type) transistors, the access transistors (Acc1 and Acc2) and driver transistors (Dr1 and Dr2) are n type (n channel type) transistors.

The MISFET is an abbreviation of Metal Insulator Semiconductor Field Effect Transistor (field effect transistor) and is sometimes called "MOS". The load transistor, access transistor, and driver transistor may hereinafter be called "transistor" simply. They may also be called with symbols (Lo1, Lo2, Acc1, Acc2, Dr1, Dr2), respectively.

Of the six transistors including the memory cell, Lo1 and Acc1 include a CMOS inverter and Lo2 and Acc2 include another CMOS inverter. Input/output terminals (storage nodes A and B) of this pair of CMOS inverters are cross-coupled to each other and include a flip flop circuit as a date storage portion for storing 1 bit of data.

The coupling relationship among these six transistors including the SRAM memory cell will next be described in detail.

Lo1 is coupled between a power supply potential (first potential) Vdd and the storage node A, Dr1 is coupled between the storage node A and a grounding potential (GND, 0V, reference potential, second potential lower than the first potential) VSS, and the gate electrodes of Lo1 and Dr1 are coupled to the storage node B.

Lo2 is coupled between the power supply potential Vdd and the storage node B, Dr2 is coupled between the storage node B and the grounding potential VSS, and the gate electrodes of Lo2 and Dr2 are coupled to the storage node A.

Acc1 is coupled between the bit line BL and the storage node A, Acc2 is coupled between the bit line /BL and the storage node B, and the gate electrodes of Acc1 and Acc2 are coupled to a word line WL (which will be a word line).

[Circuit Operation]

The circuit operation of the SRAM memory cell will next be described. When the storage node A of the CMOS inverter is at a high potential (H), Dr2 is in an ON state so that the storage node B of the other CMOS inverter becomes a low potential (L). Dr1 therefore becomes in an OFF state and the storage node A is kept at the high potential (H). This means that the respective states of the storage nodes A and B are maintained by a latch circuit in which a pair of CMOS inverters has been cross-coupled and therefore, data is stored while electricity is applied.

The word line WL is coupled to the respective gate electrodes of Acc1 and Acc2. This means that when the word line WL is at a high potential (H), Acc1 and Acc2 are in an ON state. Since a flip flop circuit and the bit lines (BL and /BL) are electrically coupled, the potential state (combination of H and L, or combination of L and H) of the storage nodes A and B appears in the bit lines BL and /BL and is read out as the data of the memory cell.

Data is written in the memory cell by setting the word line WL at a high potential (H) and setting Acc1 and Acc2 to the ON state to electrically couple the flip flop circuit and the bit lines (BL and /BL), transmit the data of the bit lines BL and /BL (combination of H and L or combination of L and H) to the storage nodes A and B and store data as described above.

Figures 2, 3:
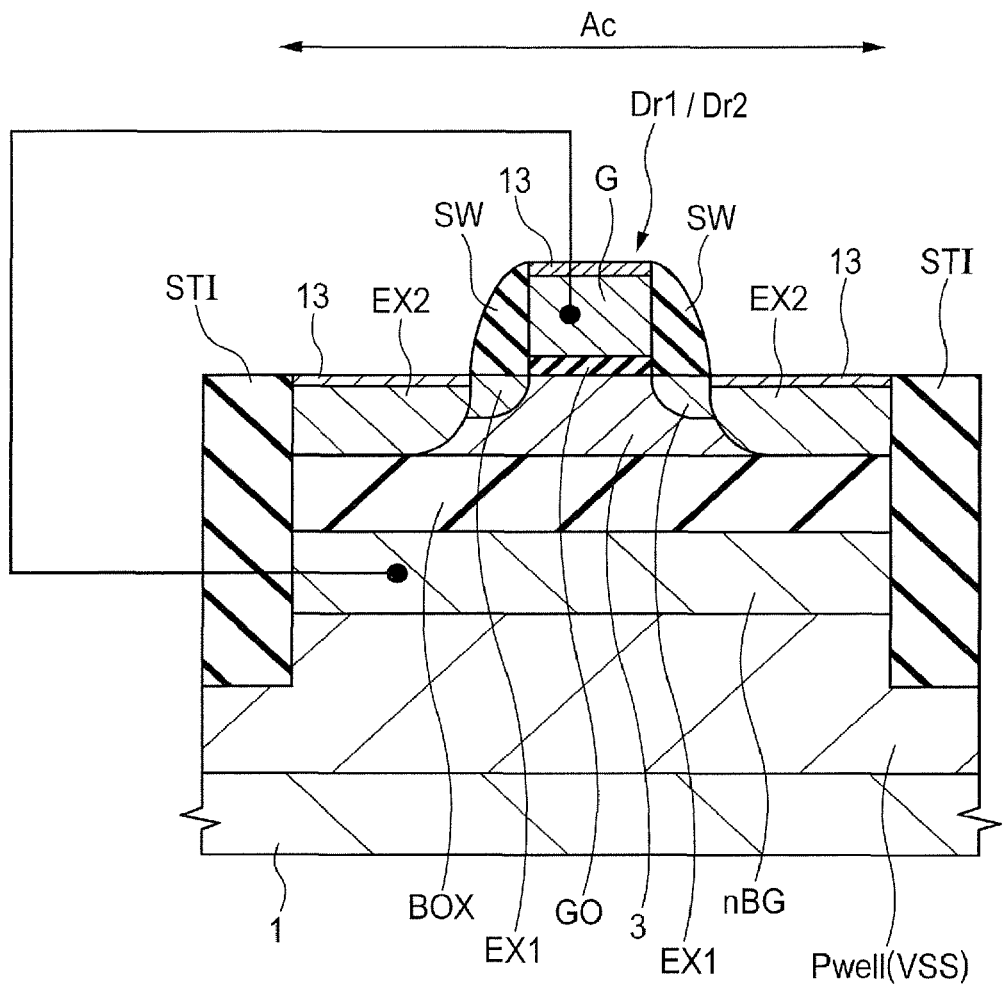
FIG. 2 is a schematic cross-sectional view of a driver transistor including the SRAM memory cell of the first embodiment.
FIG. 3 is a table showing the application state of a potential in a driver transistor.
Figure 4:
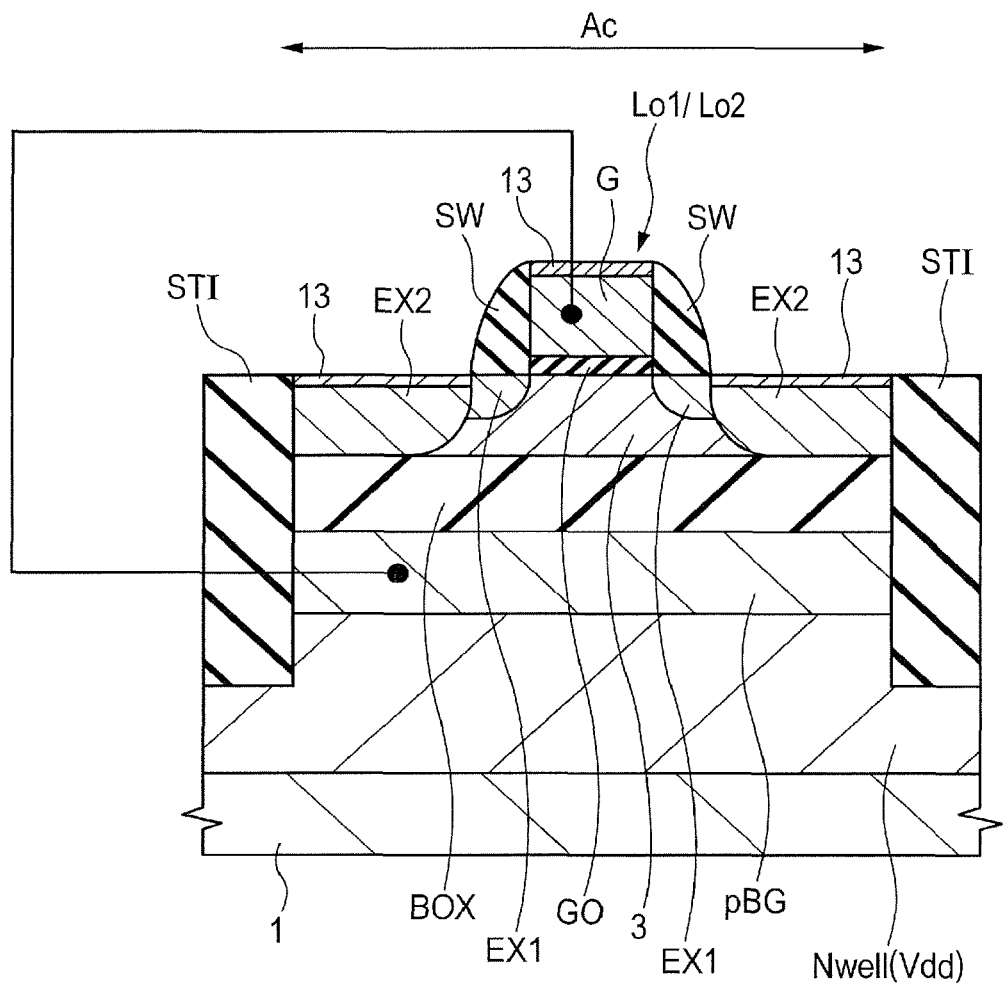
FIG. 4 is a schematic cross-sectional view of a load transistor including the SRAM memory cell of the first embodiment.
Figures 5, 6:
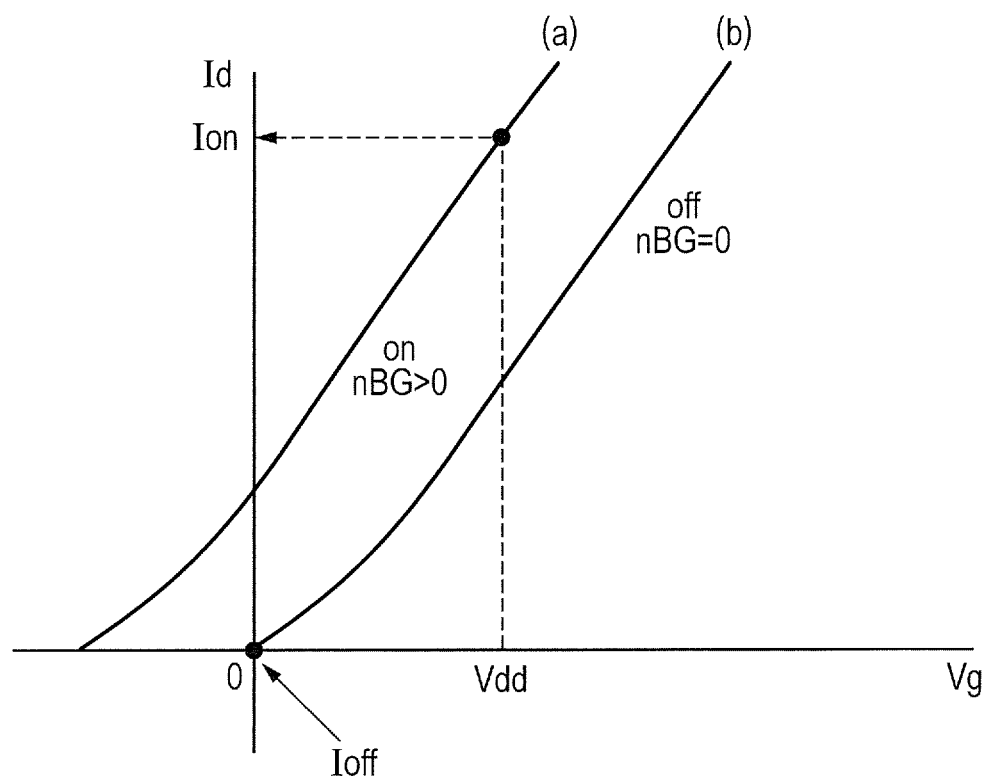
FIG. 5 is a table showing the application state of a potential in the load transistor.
FIG. 6 is a graph showing the current-voltage characteristic of an n type transistor of the first embodiment.

The characteristics of the configuration of the SRAM memory cell according to the present embodiment will next be described referring to FIGS. 2 and 3. FIG. 2 is a schematic cross-sectional view of a driver transistor (Dr1 or Dr2) including the SRAM memory cell of the present embodiment and FIG. 3 is a table showing the application state of a potential in the driver transistor (Dr1). The driver transistor (Dr2) has a similar configuration. The access transistors (Acc1 and Acc2) which are also n type transistors have also a similar configuration. FIG. 4 is a schematic cross-sectional view of a load transistor (Lo1) including the SRAM memory cell of the present embodiment. FIG. 5 is a table showing the application state of a potential in the load transistor (Lo1). The load transistor (Lo2) has a similar configuration.

As shown in FIGS. 2 and 4, six transistors including the SRAM memory cell of the present embodiment are formed on an SOI substrate. The SOI substrate has a support substrate 1, an insulating layer BOX thereon, and a semiconductor region (element formation region) 3 on the insulating layer. This element formation region is isolated by an element isolation region STI and a region partitioned by this element isolation region STI becomes an active region (element formation region, transistor formation region) Ac.

As shown in FIG. 2, the driver transistor Dr1 is formed on the main surface of the semiconductor region 3 including the SOI substrate. This transistor has a gate electrode G placed on the semiconductor region 3 via a gate insulating film GO and a source/drain region placed on both sides of the electrode G. The source/drain region has an LDD (Lightly Doped Drain) structure and has an n type lightly doped impurity region EX1 and an n type heavily doped impurity region EX2. It is to be noted that the term "source/drain region" means a region which will be a source or a drain. This source/drain region is sometimes called "one end" or "the other end" of the transistor. Indicated by reference numeral 13 is a metal silicide layer.

Below the semiconductor region 3 in which the transistor is to be placed, an n type back gate region nBG is placed via the insulating layer BOX. This back gate region nBG is also surrounded and partitioned by the element isolation region STI. The n type back gate region nBG has therebelow a p well region Pwell. The p well region extends, as described later, without interruption below the element isolation region STI.

In the n type transistor of the present embodiment, the gate electrode G of this transistor is electrically coupled to the n type back gate region nBG lying therebelow. The p well region is fixed at a grounding potential (VSS).

Thus, by electrically coupling the gate electrode G to the n type back gate region nBG lying therebelow, it is possible to set a threshold potential (Vth) at a high level at the time when a gate voltage is in the off-bias state, in other words, when the potential at the gate electrode G and the n type back gate region nBG is 0V (grounding potential, VSS). Even if the threshold potential (Vth) is set at a high level, when the gate is in an ON state, the potential on the back side becomes high simultaneously, making it possible to increase the ON-state current of the transistor and improve the operation characteristics of the transistor. In addition, it improves the controllability of the threshold potential (Vth), which means that it facilitates setting of the threshold potential (Vth) at a high level or a lower level.

Moreover, since a forward bias is not applied between the p well region Pwell and the n type back gate region nBG, a leakage current between them can be reduced.

For example, when the storage node B of the CMOS inverter is at a high potential level (H), Dr1 which is an n type transistor becomes ON state (on). This means that as shown in FIG. 3, a power supply potential (Vdd) is applied to the gate electrode G and the n type back gate region nBG. At this time, the p well region is fixed at a grounding potential (VSS), reverse bias is applied between the p well region Pwell and the n type back gate region nBG.

When the storage node B of the CMOS inverter is at a low potential level (L), the Dr1, which is an n type transistor, is turned OFF (off). As shown in FIG. 3, a grounding potential (VSS) is applied to the gate electrode G and the n type back gate region nBG. At this time, the p well region is fixed at the grounding potential (VSS) so that the p well region Pwell and the n type back gate region nBG are at the same potential level. Thus, no forward bias is applied between the p well region Pwell and the n type back gate region nBG.

As shown in FIG. 4, the load transistor Lo1 is formed in the main surface of a semiconductor region 3 including the SOI substrate. This transistor has a gate electrode G placed over the semiconductor region 3 via a gate insulating film G and a source/drain region placed on both sides of this gate electrode G. This source/drain region has an LDD structure and has a p type lightly doped impurity region EX1 and a p type heavily doped impurity region EX2.

Below the semiconductor region 3 in which the load transistor Lo1 is placed, a p type back gate region pBG is placed via an insulating layer BOX. This back gate region pBG is also surrounded and partitioned by the element isolation region STI. Furthermore, the p type back gate region pBG has therebelow an n well region Nwell. The n well region extends without interruption below the element isolation region STI as described later.

In the load transistor Lo1 of the present embodiment, the gate electrode G of this transistor is electrically coupled to the p type back gate region pBG therebelow. The n well region is fixed at a power supply potential (Vdd).

Thus, by placing the p type back gate region pBG below the gate electrode G, the state between them becomes roughly proportional and for example, the threshold potential (Vth) can be set at the vicinity of 0V when no bias is applied, in other words, no potential is applied to the gate electrode G and the p type back gate region pBG. The threshold potential (Vth) can be set at a low level, making it possible to increase the ON-state current of the transistor and improve the operation characteristics of the transistor. In addition, it improves the controllability of the threshold potential (Vth), meaning that it facilitates setting of the threshold potential (Vth) at a high level or a lower level.

In the p type transistor (load transistor), similar to the n type transistors (driver transistor and access transistor), it is possible to increase the threshold voltage in an OFF state and increase the On-state current along with a variation of the potential of the back side (back gate) in an ON state.

Furthermore, a forward bias is not applied between the n well region Nwell and the p type back gate region pBG so that a leakage current between them can be reduced.

For example, when the storage node B of the CMOS inverter is at a low potential level (L), Lo1, which is a p type transistor, becomes ON state (on). As shown in FIG. 5, a grounding potential VSS is applied to the gate electrode G and the p type back gate region pBG. At this time, the n well region is fixed at the power supply potential (Vdd) so that a reverse bias is applied between the n well region Nwell and the p type back gate region pBG.

When the storage node B of the CMOS inverter is at a high potential level (H), Lo1, which is a p type transistor, becomes OFF state. This means, as shown in FIG. 5, a power supply potential Vdd is applied to the gate electrode G and the p type back gate region pBG. At this time, the n well region is fixed at a power supply potential (Vdd) so that the potential level of the n well region Nwell becomes equal to that of the p type back gate region pBG. Thus, no forward bias is applied between the p well region Pwell and the n type back gate region nBG.

Figure 7:
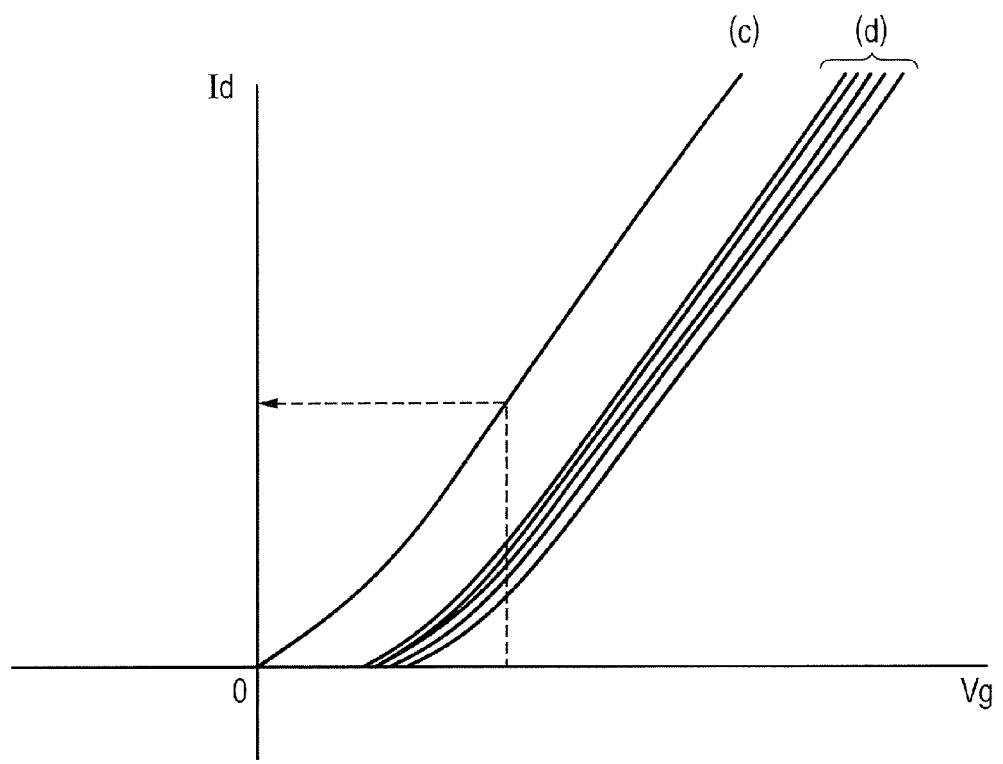
FIG. 7 is a graph showing the current-voltage characteristic of an n type transistor of Comparative Example.

FIG. 6 is a graph showing the current-voltage characteristic of the n type transistor according to the present embodiment. FIG. 7 is a graph showing the current-voltage characteristic of the n type transistor according to Comparative Example. A drain current (Id) is plotted along the ordinate, while a gate voltage (Vg) is plotted along the abscissa. As shown in FIG. 6, when a back gate potential is positive (nBG>0), the current-voltage characteristic is as shown by the graph (a). On the other hand, when a back gate potential is 0 (nBG=0), the current-voltage characteristic is as shown by the graph (b). Therefore, when the transistor is in an ON state, a high ON-state current (Ion) in the graph (a) can be obtained by setting the back gate potential to a positive value (nBG>0) and decreasing the threshold potential (Vth) of the transistor. When the transistor is in an OFF state, on the other hand, a low OFF-state current (Ioff) in the graph (b) can be obtained by setting the back gate potential to zero (nBG=0) and increasing the threshold potential (Vth) of the transistor.

On the other hand, in Comparative Example 1 in which the back gate potential is fixed at zero (nBG=0), the ON-state current (Ion) becomes smaller as shown in the graph (c) of FIG. 7. In Comparative Example 2 in which the impurity concentration of a channel region (semiconductor region 3) has been adjusted to adjust the threshold voltage (Vth), although the current-voltage characteristic of the transistor can be shifted, the threshold voltage (Vth) varies as shown in the graph (d), leading to a wide variation in the ON-state current (Ion).

According to the present embodiment, on the other hand, by electrically coupling the back gate region to the gate electrode, the back gate potential can be controlled dynamically so as to make the threshold potential (Vth) low when the transistor is in an ON state and make it high when the transistor is in an OFF state (refer to the graphs (a) and (b) of FIG. 6). As a result, as described above, a ratio of the ON-state current to the OFF-state current of the transistor can be increased and high switching characteristics can be obtained. Even a low-voltage driven (for example, having a power supply potential Vdd of from about 0.4 to 0.8V) transistor designed based on a fine rule can have improved transistor characteristics. In FIG. 7, a transistor having a threshold voltage (Vth) adjusted by impurities in the channel region (semiconductor region 3) is shown as Comparative Example 2. Also in the present embodiment, impurities may be implanted in the channel region (semiconductor region 3) for further adjustment of the threshold voltage (Vth). As described above, however, using a (non-doped) transistor having no impurities in the channel region thereof can reduce the variation in the characteristics.

Moreover, when the n well region Nwell is set at a power supply potential Vdd (for example, 0.5V) and the p well region Pwell is set at a second reference potential VSSB (for example, −0.5V) which is a negative potential, a reverse bias is applied between the p well region Pwell (−0.5V) and the n type back gate region nBG (0V) even if Dr1 is in an OFF state. Thus, it becomes possible to set a threshold voltage (Vth, drive potential) within a range of −0.5V to +0.5V without applying a forward bias to PN junction between the well region and the back gate region. This means that while the back gate region is grounded (0V) and under the normal condition, the threshold potential (Vth) can be set at a high level or a low level. By setting the threshold potential (Vth) in such a manner and increasing a ratio of the ON-state current to the OFF-state current of the transistor, high switching characteristics can be achieved even at a low-voltage drive.

It is also possible to set the n well region NwellB at a second power supply potential VddB (for example, 0.5+αV) which is a power supply potential Vdd+α and the p well region Pwell at a grounding potential VSS (for example, 0V). Also in this case, without applying a forward bias to the PN junction between the well region and the back gate region, a ratio of the ON-state current to the OFF-state current of the transistor can be made greater and a high switching characteristic can be attained.

Figures 8, 9:
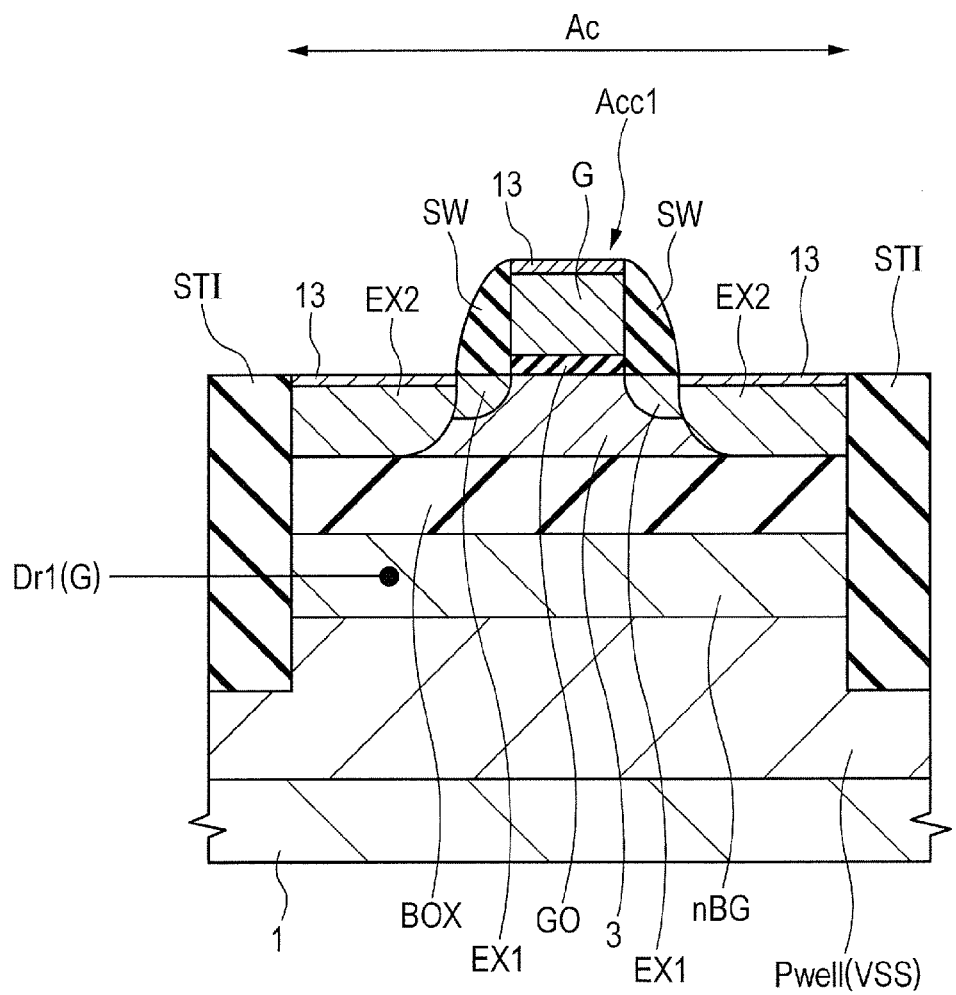
FIG. 8 is a schematic cross-sectional view of an access transistor including the SRAM memory cell of the first embodiment.
FIG. 9 is a table showing one example of the application state of a potential in the access transistor.
Figure 10:
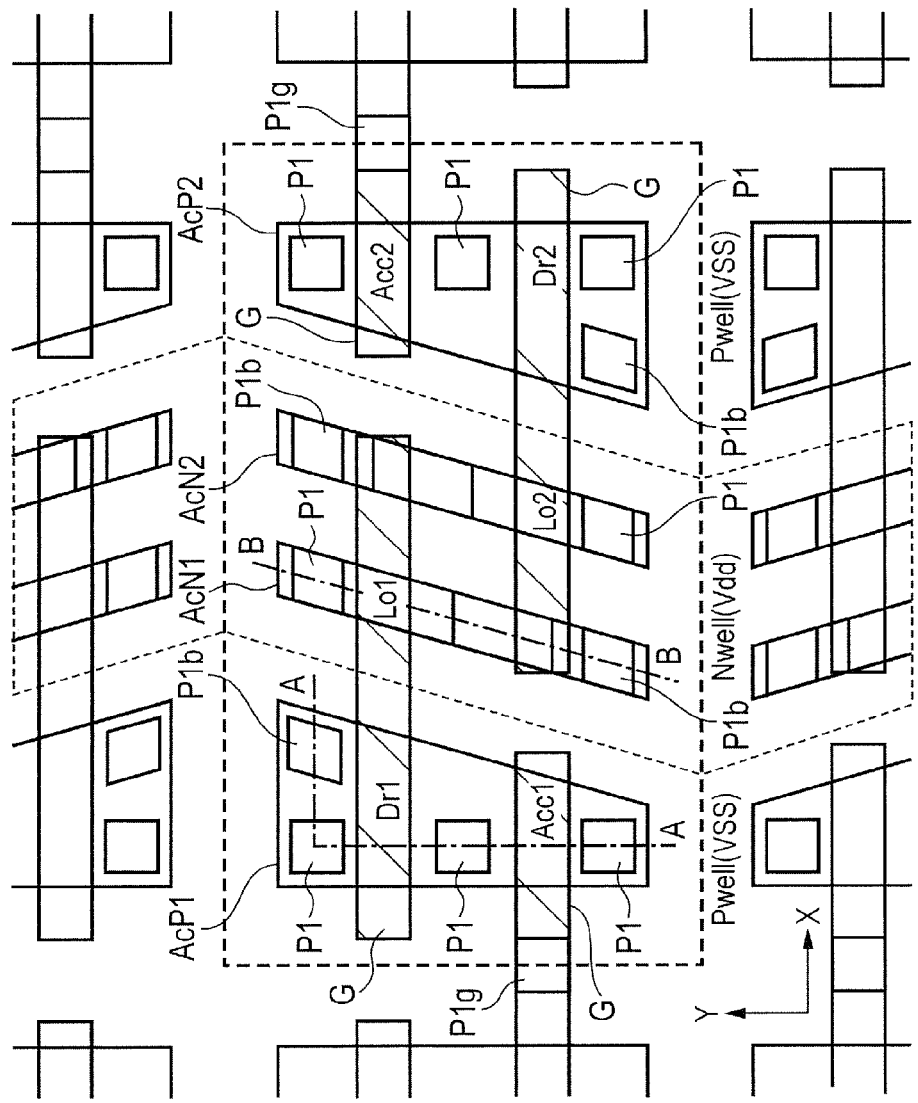
FIG. 10 is a plan view showing the configuration of the SRAM memory cell according to the first embodiment.

Of the n type transistors (Dr1, Dr2, Acc1, and Acc2) including the SRAM memory cell of the present embodiment, the access transistors (Acc1 and Acc2) and the driver transistors Dr2) are sometimes formed in the same active region Ac (refer to FIG. 10). FIG. 8 is a schematic cross-sectional view of the access transistor Acc1 including the SRAM memory cell of the present embodiment and FIG. 9 is a table showing one example of the application state of a potential in the access transistor Acc1. It is to be noted that the access transistor Acc2 has a similar configuration.

As shown in FIG. 8, in this access transistor Acc1, the n type back gate region nBG lying therebelow is electrically coupled to the gate electrode G of the driver transistor (Dr1). The access transistor Acc1 is not always in the same ON/ODFF state as the driver transistor Dr1. For example, as shown in FIG. 9, even when the access transistor Acc1 is in an ON state, a grounding potential (VSS=0V) may be applied to the n type back gate region nBG and the p well region Pwell may be fixed at a grounding potential (VSS). In such a case, as shown in the graph (b) of FIG. 6, the threshold potential (Vth) tends to show an increase and the ON-state current (Ion) tends to decrease.

Thus, the potential of the back gate region nBG sometimes prevents the access transistor (Acc1, Acc2) from being brought into an ON state. In this case, to complement the operation, the potential of the gate electrode G (that is, the potential of the word line WL) is made greater (second power supply potential VddB=Vdd+α) than the gate potential (for example, Vdd) to be applied to the driver transistor (Dr1, Dr2). This means that the potential of the word line WL is boosted. For example, it is boosted by from about 0.1 to 0.2V relative to the power supply potential Vdd (from 0.4 to 0.8V). In other words, the drive potential (threshold potential, potential for bringing it into an ON state) of the access transistor (Acc1, Acc2) is set greater than that of the driver transistor (Dr1, Dr2).

This makes it possible to increase the ON-state current of the access transistor (Acc1, Acc2) and improve the operation characteristic of it. In particular, the word line WL is not coupled to another wiring or another site and is an independent wiring so that a potential can easily be applied to it independently as described above.

It is also possible to form that the access transistor (Acc1, Acc2) in an active region different from the region where the driver transistor (Dr1, Dr2) is formed and electrically couple the back gate region to the gate electrode.

[Structure of SRAM] [Configuration of Memory Cell]

Referring to plan views and cross-sectional views, the structure of the SRAM memory cell of the present embodiment will next be described.

Figure 11:
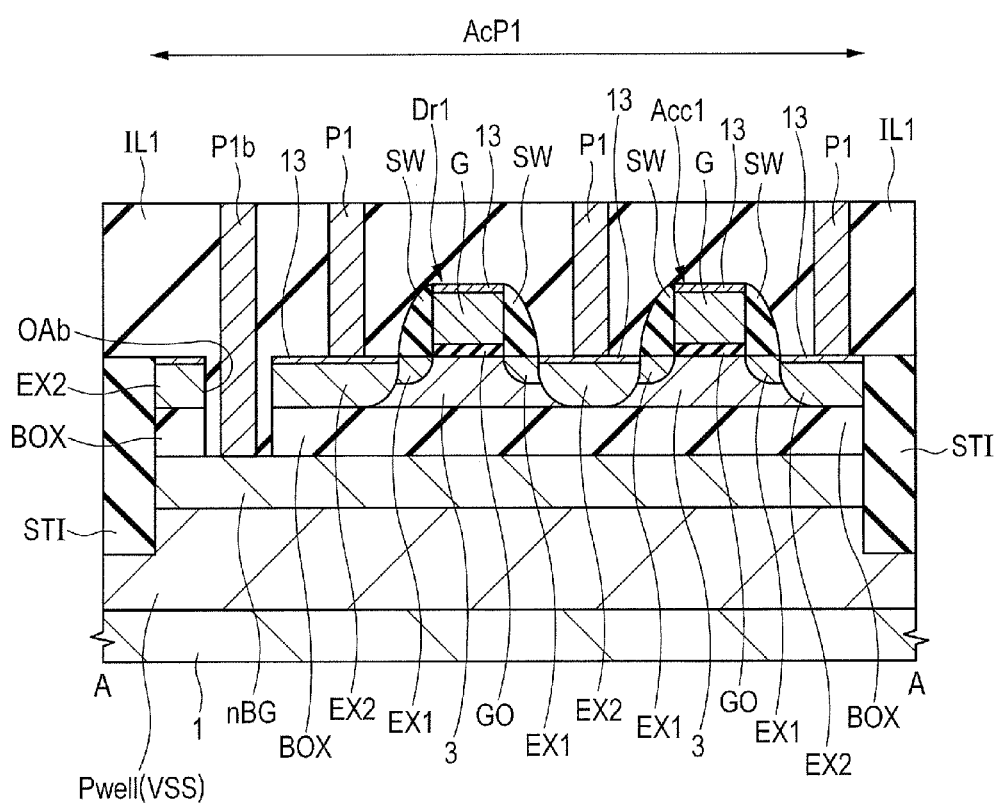
FIG. 11 is a cross-sectional view showing the configuration of the SRAM memory cell according to the first embodiment.
Figure 12:
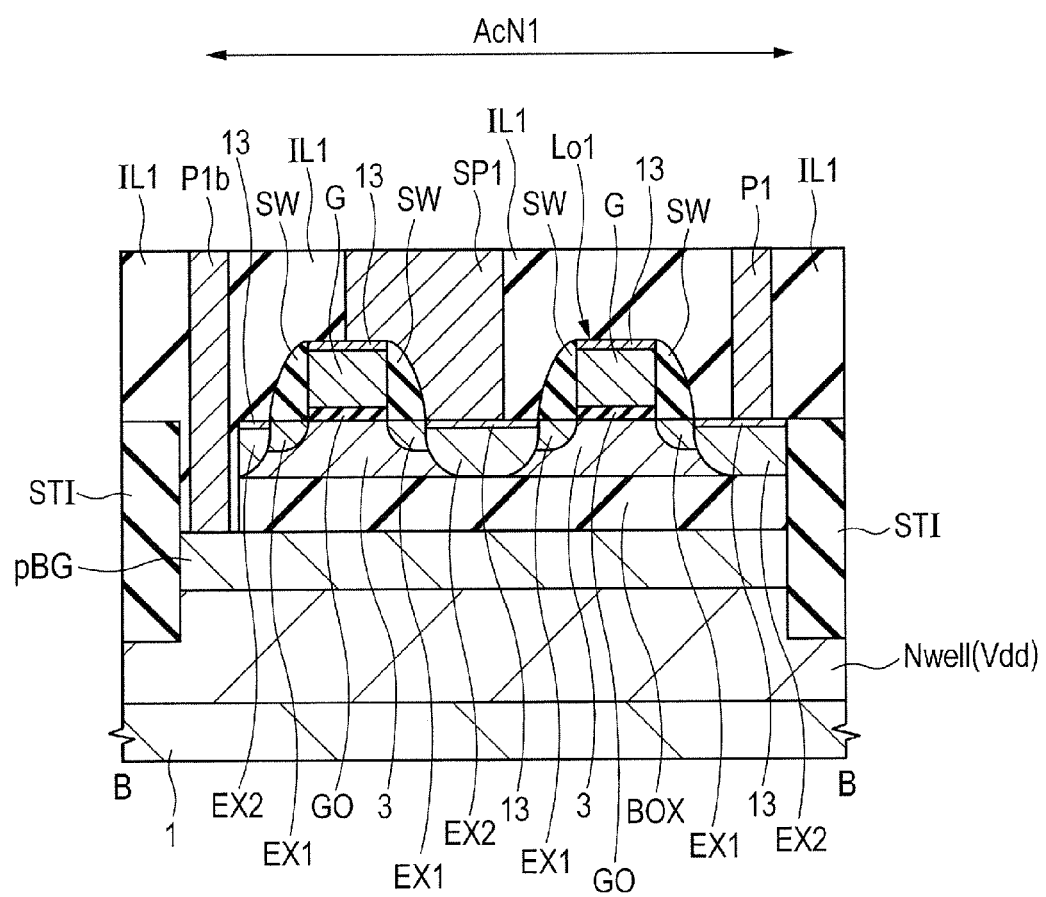
FIG. 12 is a cross-sectional view showing the configuration of the SRAM memory cell according to the first embodiment.
Figure 13:
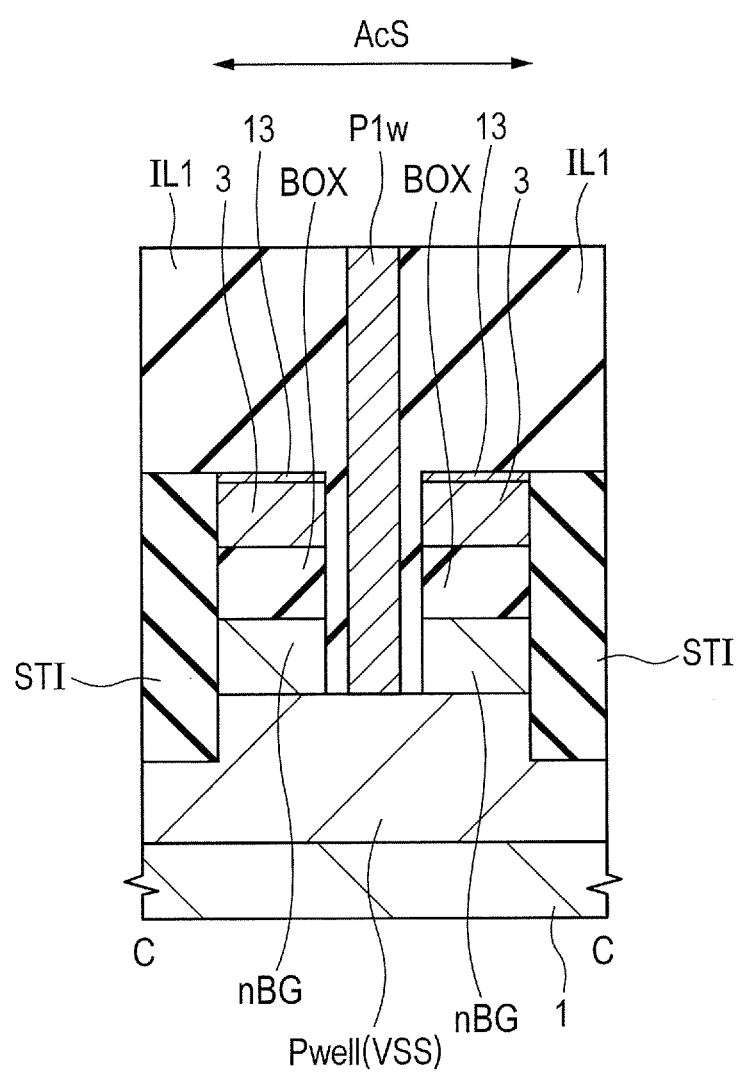
FIG. 13 is a cross-sectional view of a tap cell region of the SRAM according to the first embodiment.
Figure 14:
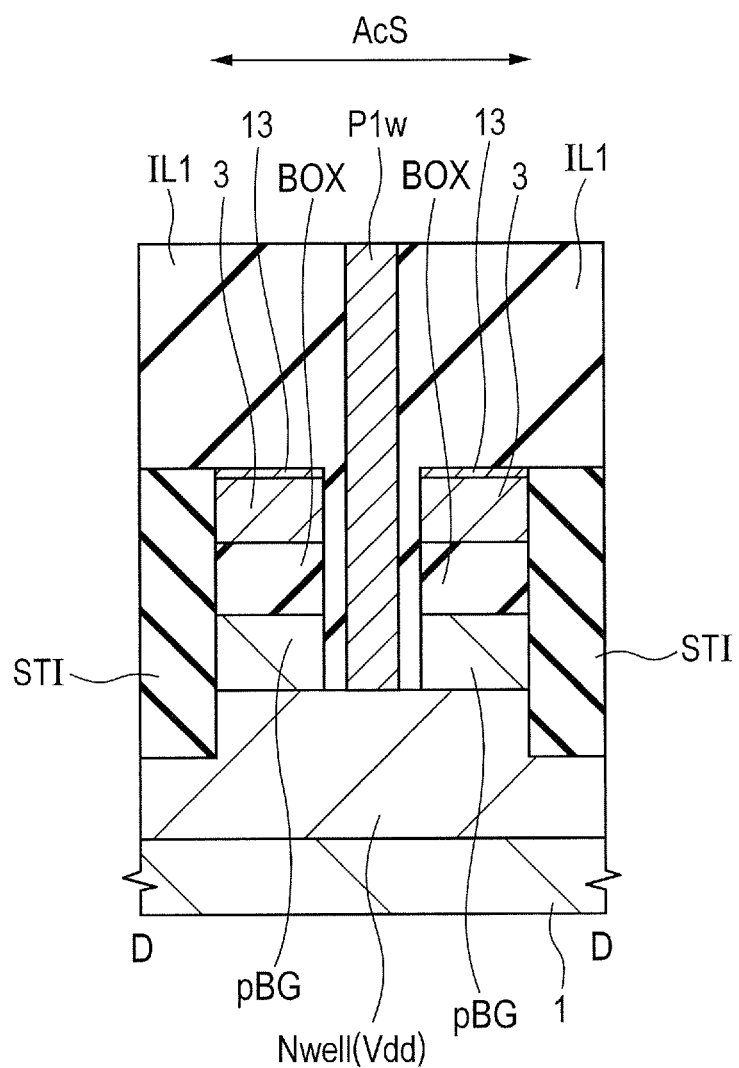
FIG. 14 is a cross-sectional view of the tap cell region of the SRAM according to the first embodiment.

FIG. 10 is a plan view showing the configuration of the SRAM memory cell of the present embodiment. FIGS. 11 and 12 are cross-sectional views showing the configuration of the SRAM memory cell of the present embodiment. FIG. 11 corresponds to the A-A cross-section of FIG. 10, while FIG. 12 corresponds to the B-B cross-section of FIG. 10. In this specification, only the cross-sectional views of active regions AcP1 and AcN1 which will be described later are shown to simplify the drawing, but corresponding cross-sections of the active regions AcP2 and AcN2 also have a similar structure. FIGS. 13 and 14 are cross-sectional views of a tap cell region (FIG. 24) which will be described later. FIG. 13 corresponds to the C-C cross-section of FIG. 24 and FIG. 14 corresponds to the D-D cross-section of FIG. 24.

As shown in FIGS. 10 to 12, the SRAM memory cell of the present embodiment is formed in an SOI substrate. The SOI substrate has, as described above, a support substrate 1, an insulating layer BOX, and a semiconductor region (element formation region) 3 thereon. This semiconductor region (element formation region) 3 is isolated by an element isolation region STI. The region partitioned by this element isolation region STI is also called "active region Ac".

As shown in FIGS. 11 and 12, the active region (semiconductor region 3) Ac has therebelow the insulating layer BOX. Moreover, in the present embodiment, the insulating layer BOX has therebelow a back gate region (BG) and the back gate region has therebelow a well region (well). The back gate region BG made of an n type semiconductor region is an n type back gate region nBG, while that made of a p type semiconductor region is a p type back gate region pBG. The well region made of an n type semiconductor region is an n well region Nwell and that made of a p type semiconductor region is a p well region Pwell.

A substantially rectangular region surrounded by a broken line in FIG. 10 is a 1 (1 bit) memory cell region. As shown in this drawing, in the memory cell region, a p well region (Pwell), an n well region (Nwell), and a p well region (Pwell) are arranged in the order of mention in the X direction (first direction, a horizontal direction in FIG. 10). Although only 1 (1 bit) memory cell region is shown in FIG. 10, the memory cell is arranged repeatedly in the X direction (first direction) and in the Y direction (second direction intersecting with the first direction, a perpendicular direction in FIG. 10) as will be described later (refer to FIG. 22), these well regions (Pwell, Nwell, and Pwell) extend in the Y direction. At this time, the p well region Pwell extends mainly in the Y direction, but extends in a zigzag manner with a predetermined width (refer to FIG. 22). Although in the memory cell region, the n well region Nwell extends in the Y direction on both sides of the p well region Pwell, a P well outside the memory cell region is in contact with a P well in a memory cell adjacent thereto so that when viewed as an entire memory cell array, a p well region (Pwell) and an n well region (Nwell) are arranged alternately in the X direction (refer to FIG. 22).

In the memory cell region, four active regions (AcP1, AcN1, AcN2, and AcP2) are arranged in this order in the X direction. Here, the symbol "Ac" meaning an active region is attached with another symbol to indicate an individual region. These active regions (Ac) have therebetween an element isolation region (STI) as described above. In other words, these active regions (Ac) are partitioned by the element isolation region (STI).

In addition, as described above, the active region (Ac) has therebelow the back gate region BG via the insulating layer BOX. This back gate region BG is also partitioned and isolated by the element isolation region (STI). The back gate region BG has therebelow a well region (Pwell, Nwell, Pwell) and each well region extend without interruption below the element isolation region STI (refer to FIG. 22).

In other words, the depth (distance from the substrate surface to the bottom) DAc of the active region Ac (semiconductor region 3) is smaller than the depth DSTI of the element isolation region STI (DAc<DSTI). The depth DBG of the back gate region BG is smaller than the depth DSTI of the element isolation region STI (DBG<DSTI). The depth Dwell of the well region is greater than the depth DSTI of the element isolation region STI (Dwell>DSTI).

More specifically, the active region AcP1 is a quadrangle with a long side in the Y direction. More specifically, it is a trapezoid long in the width of a portion where a plug P1b which will be described later is placed. In other words, the active region AcP1 has a wide portion so that the X-direction width (length) of one Y-direction end is greater than the X-direction width of the other Y-direction end. In FIG. 10, this wide portion is present in the upper portion. This active region AcP1 has therebelow an n type back gate region nBG via the insulating layer BOX. This n type back gate region nBG has therebelow a p well region (Pwell) (refer to FIG. 11).

The active region AcN1 is a parallelogram having a long side in the Y direction (FIG. 10). This active region AcN1 has therebelow a p type back gate region pBG via the insulating layer BOX. This p type back gate region pBG has therebelow an n well region (Nwell) (refer to FIG. 12).

The active region AcN2 is a parallelogram having a long side in the Y direction (FIG. 10). This active region AcN2 has therebelow a p type back gate region pBG via the insulating layer BOX. This p type back gate region pBG has therebelow an n well region (Nwell) (refer to FIG. 12).

The active region AcP2 is a quadrangle with a long side in the Y direction. More specifically, it is a trapezoid long in the width of a portion where a plug P1b which will be described later is placed. In other words, the active region AcP2 has a wide portion so that the X-direction width (length) of one Y-direction end is greater than the X-direction width of the other Y-direction end. In FIG. 10, this wide portion is present in the lower portion. This means that this active region has a wide portion at an end portion on the side opposite to the active region AcP1. This active region AcP2 has therebelow an n type back gate region nBG via the insulating layer BOX. This n type back gate region nBG has therebelow a p well region (Pwell) (refer to FIG. 11).

As shown in FIG. 10, these four active regions (AcP1, AcN1, AcN2, and AcP2) have thereover gate electrodes (gate wirings, linear gates) G via a gate insulating film (GO, refer to FIG. 11, FIG. 12, and the like), respectively. The gate electrodes extend so as to cross each active region in the X direction and includes six transistors described above in the column of [circuit configuration]. The active region (Ac) on both sides of the gate electrode becomes a source/drain region (refer to FIG. 11, FIG. 12, and the like) of the transistor.

More specifically, a gate electrode G shared by the active regions AcP1 and AcN1 is placed so as to cross over them, by which Dr1 is placed over the active region AcP1 and Lo1 is placed over the active region AcN1 and gate electrodes (G) of them are coupled to each other. This shared gate electrode G extends over the active region AcN2 and is coupled to the source/drain region of Lo2 by a shared plug SP1 which will be described later.

The active region AcP1 has thereover another gate electrode G parallel to the shared gate electrode G, by which Acc1 is placed over the active region AcP1 and the source/drain region of Dr1 and the source/drain region of Acc1 are coupled (shared).

Further, a gate electrode G shared by the active region AcP2 and AcN2 is placed so as to cross over them, by which Dr2 is placed over the active region AcP2 and Lo2 is placed on the active region AcN2 and gate electrodes (G) of them are coupled to each other. This shared gate electrode G extends over the active region AcN1 and is coupled to the source/drain region of Lo1 by a shared plug SP1 which will be described later.

The active region AcP2 has thereover another gate electrode G parallel to the shared gate electrode G, by which Acc2 is placed over the active region AcP2 and the source/drain region of Dr2 and the source/drain region of Acc2 are coupled (shared).

Each two of these four gate electrodes G are placed on the same line (in a straight line). More specifically, the shared gate electrode G crossing over the active regions AcP1 and AcN1 and the gate electrode G over the active region AcP2 are placed on the same line extending in the X direction. The shared gate electrode G crossing over the active regions AcP2 and AcN2 and the gate electrode G over the active region AcP1 are placed on the same line extending in the X direction.

Over the source/drain region of the six transistors (Dr1, Acc1, Lo1, Lo2, Acc2, and Dr2), a first plug P1 is placed. In addition, over the four gate electrodes described referring to FIG. 2, a first plug P1 placed. Of the first plugs (P1) over the gate electrode, the first plug coupled only to the gate electrode is called "P1g" and the first plug including a shared plug which will be described later is called "SP1".

In the present embodiment, the memory cell region has, in addition to the above-described first plugs (P1, P1g, and SP1), a plug P1b reaching the back gate region BG (refer to FIGS. 11 and 12). Furthermore, a tap cell region which will be described later has a plug P1w reaching the well region well (refer to FIGS. 13 and 14).

Over these first plugs P1 (including P1g, SP1, P1b, and P1w), a first-level wiring M1 is placed. Electric coupling between the first plugs P1 can be achieved via this first-level wiring M1 and a second-level wiring M2 and the like lying thereover.

Figure 15:
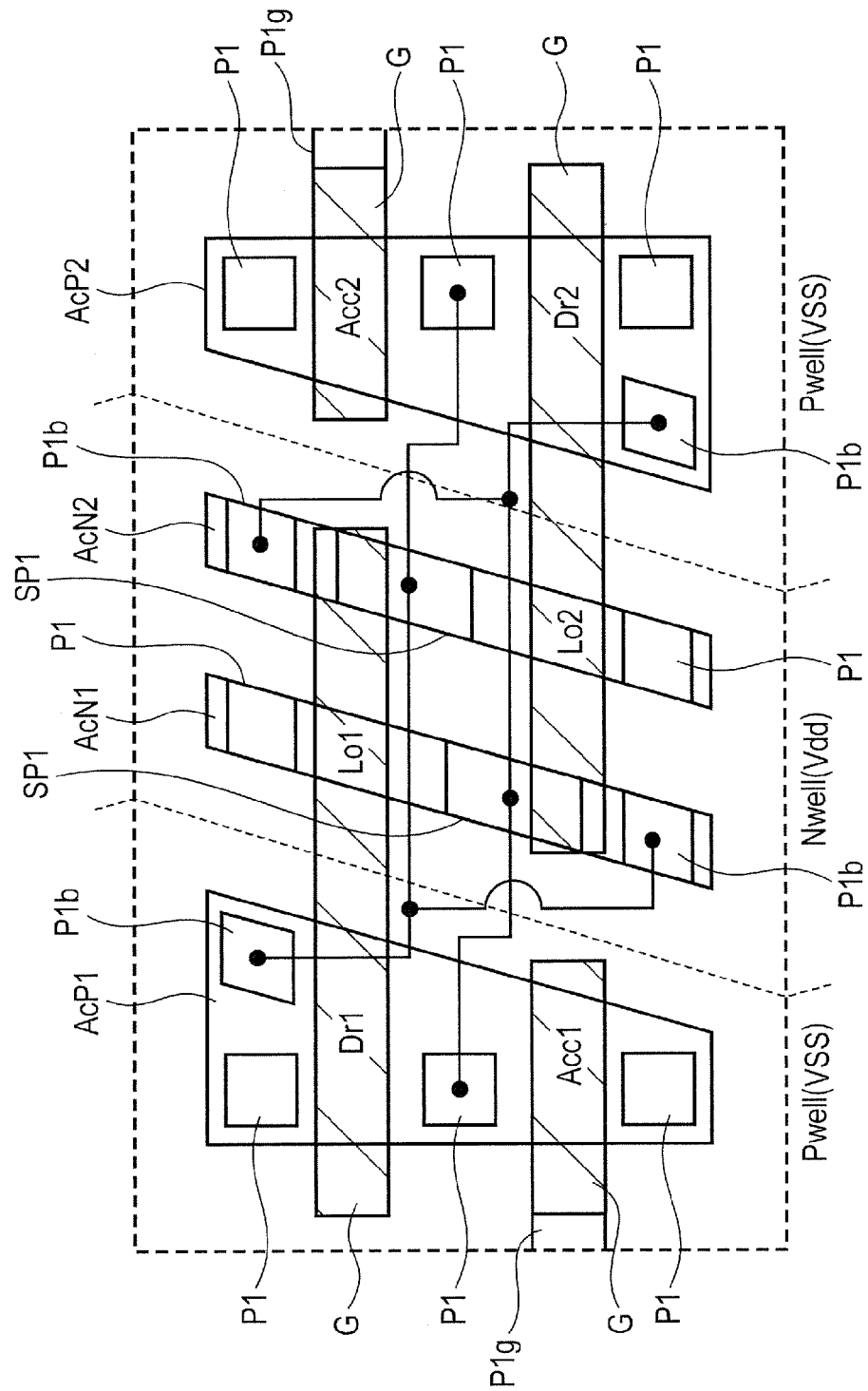
FIG. 15 is a plan view conceptually showing electric coupling between first plugs of the SRAM according to the first embodiment.

In the present embodiment, as described above, in each of four transistors (Dr1, Lo1, Lo2, and Dr2) other than the access transistors (Acc1 and Acc2), the gate electrode and the back gate region BG are electrically coupled to each other. FIG. 15 is a plan view conceptually showing electric coupling between the first plugs P1 (including P1g, SP1, P1b, and P1w).

Described specifically, a shared plug (shared contact) SP1 for connecting a shared gate electrode G of Lo2 and Dr2 with the other source/drain region of Lo1 is electrically coupled to the first plug P1 on the shared source/drain region of Dr1 and Acc1. This coupling portion can be corresponded to the storage node A of FIG. 1. This coupling portion is coupled to the n type back gate region nBG placed below the active region (semiconductor region 3) AcP2 via the plug P1b placed on the other source/drain region side of Dr2. This coupling portion is coupled to the p type back gate region pBG placed below the active region (semiconductor region 3) AcN2 via the plug P1b.

Furthermore, a shared plug (shared contact) SP1 for connecting a shared gate electrode G of Lo1 and Dr1 with the other source/drain region of Lo2 is electrically coupled to the first plug P1 on the shared source/drain region of Dr2 and Acc2. This coupling portion can be corresponded to the storage node B of FIG. 1. This coupling portion is coupled to the n type back gate region nBG placed below the active region (semiconductor region 3) AcP1 via the plug P1b placed on the other source/drain region side of Dr1. This coupling portion is coupled to the p type back gate region pBG placed below the active region (semiconductor region 3) AcN1 via the plug P1b.

No limitation is imposed on the specific coupling form of them, for example, layout of the first-level wiring M1, a second plug P2, a second-level wiring M2, a third plug P3, and a third-level wiring M3 insofar as they satisfy the coupling state between the first plugs P1 shown in FIG. 15. One example of the layout is shown in FIGS. 16 to 18.

Figure 16:
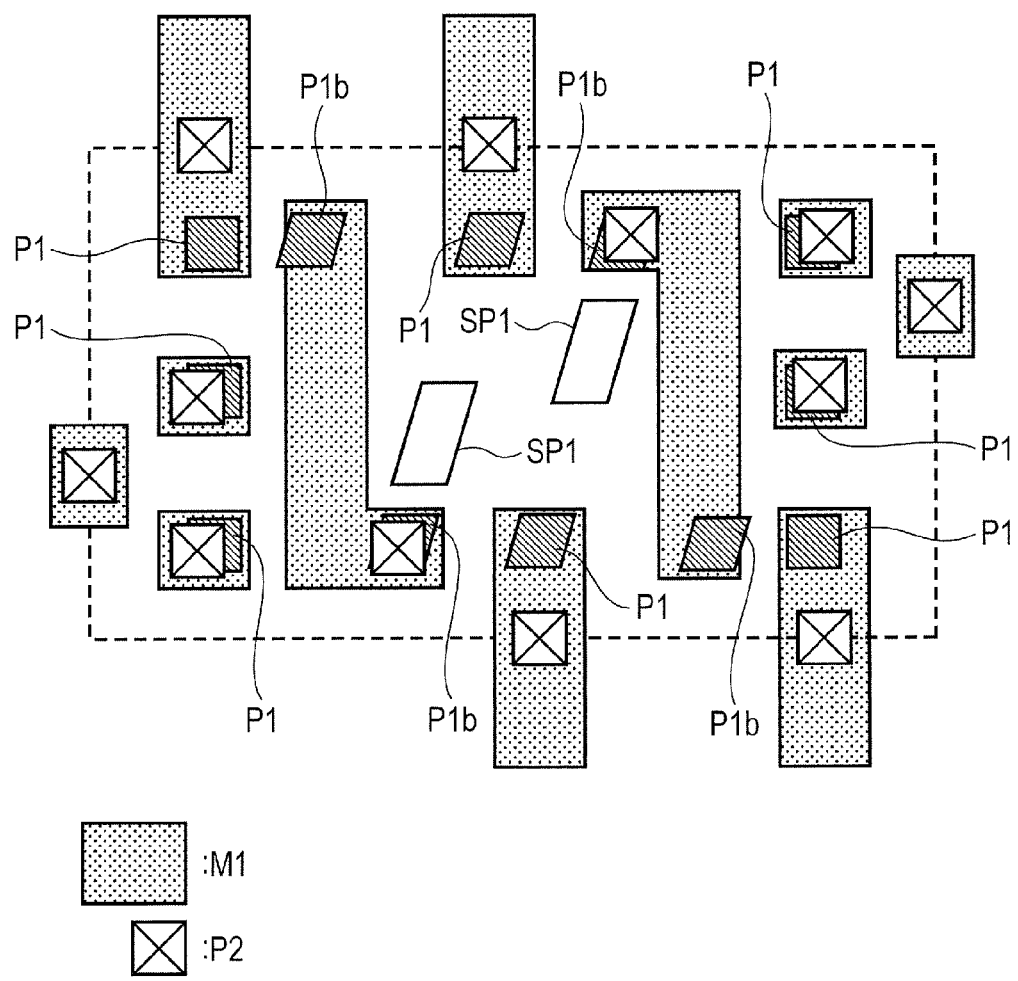
FIG. 16 is a plan view showing the configuration of the SRAM memory cell according to the first embodiment.
Figure 17:
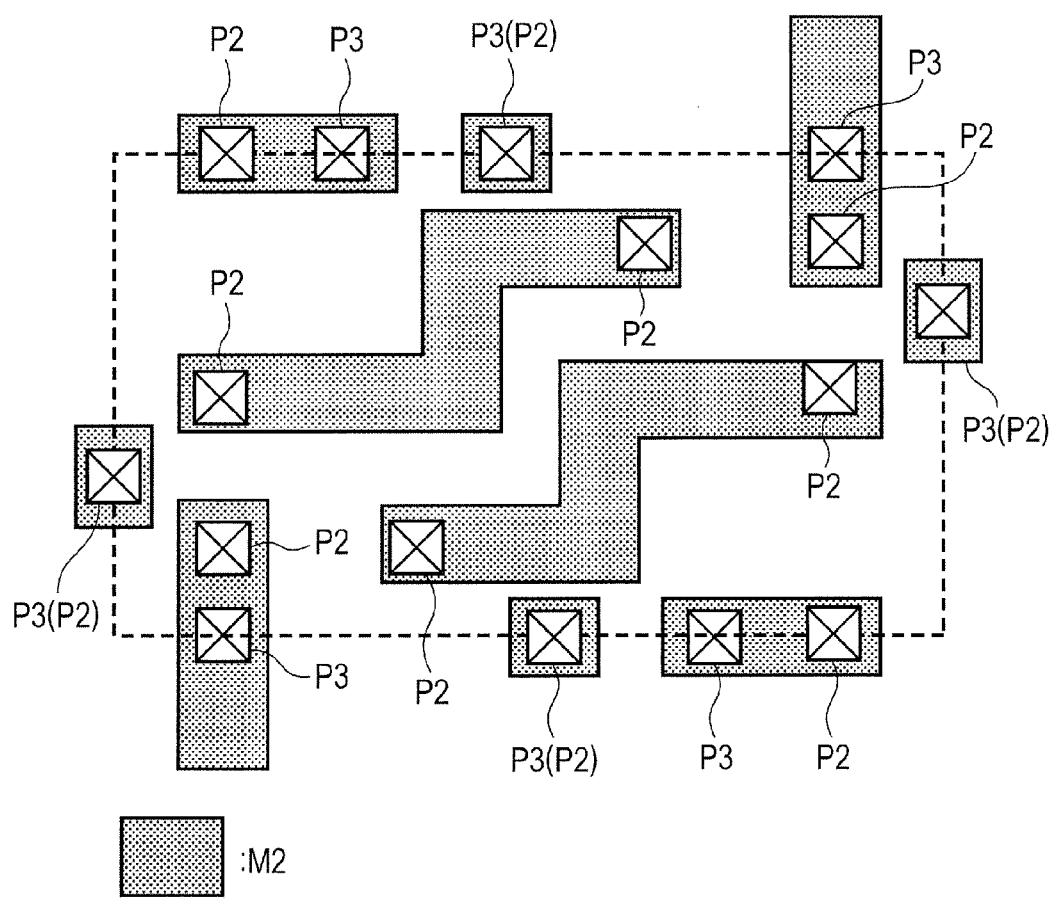
FIG. 17 is a plan view showing the configuration of the SRAM memory cell according to the first embodiment.
Figure 18:
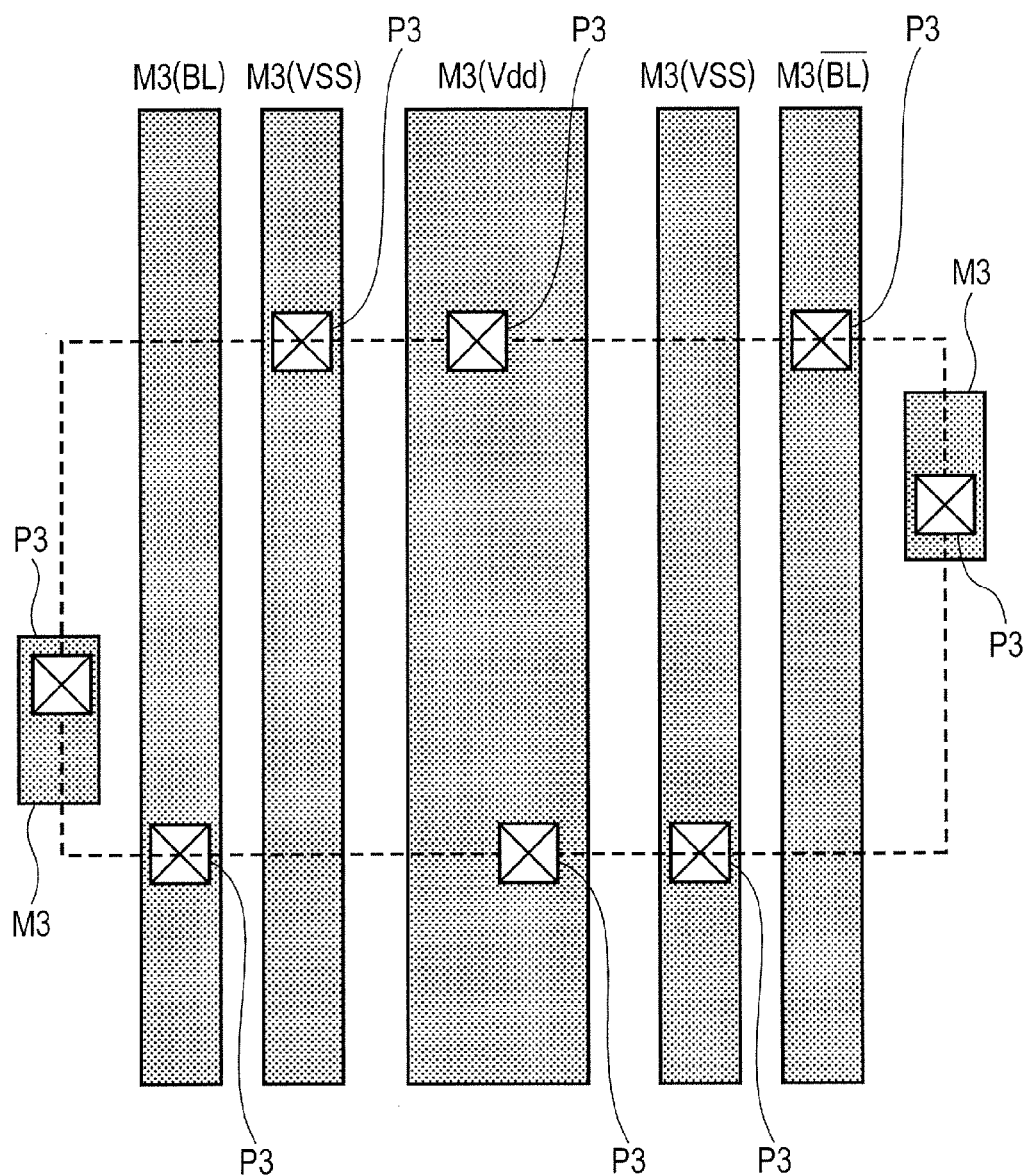
FIG. 18 is a plan view showing the configuration of the SRAM memory cell according to the first embodiment.

FIGS. 16 to 18 are plan views showing the configuration of the SRAM memory cell of the present embodiment. FIG. 10 shows the arrangement of the active region Ac, the gate electrode G, and the first plug P1, while FIG. 16 shows the arrangement of the first plug P1, the first-level wiring M1, and the second plug P2. The plan views of the FIG. 10 and FIG. 16 therefore clearly show the positional relationship among the patterns shown in the drawings by overlapping them at their first plugs P1. FIG. 17 shows the arrangement of the second plug P2, the second-level wiring M2, and the third plug P3. FIGS. 16 and 17 therefore clearly show the positional relationship among the patterns shown in these drawings by overlapping them at their second plugs P2. FIG. 18 shows the arrangement of the third plug P3 and the third third-level wiring M3. FIGS. 17 and 18 therefore clearly show the positional relationship among the patterns shown in these drawings by overlapping them at their third plugs P3.

More specifically, the plug P1b to be coupled to the n type back gate region nBG placed below the active region (semiconductor region 3) AcP1 and the plug P1b to be coupled to the p type back gate region pBG placed below the active region (semiconductor region 3) AcN1, each shown in FIG. 10, are coupled to each other via an L-shaped first-level wiring M1 (FIG. 16). The plug P1b to be coupled to the n type back gate region nBG placed below the active region (semiconductor region 3) AcP2 and the plug P1b to be coupled to the p type back gate region pBG placed below the active region (semiconductor region 3) AcN2 are coupled to each other via an inverted L-shaped first-level wiring M1 (FIG. 16). These first-level wirings M1 have thereon a second plug P2 (FIG. 16).

The first plug to be coupled to the source/drain region of Lo2 shown on the lower side in FIG. 10 has thereon a first-level wiring M1 and this first-level wiring M1 extends to an adjacent memory cell region (here, the memory cell region located on the lower side in this drawing). The first plug to be coupled to the source/drain region of Dr2 on the lower side in the drawing has thereon a first-level wiring M1 and this first-level wiring M1 extends to the adjacent memory cell region (here, the memory cell region located on the lower side in this drawing). The first plug to be coupled to the source/drain region of Lo1 on the upper side in the drawing has thereon a first-level wiring M1 and this first-level wiring M1 extends to an adjacent memory cell region (here, the memory cell region located on the upper side in this drawing). The first plug to be coupled to the source/drain region of Dr1 on the upper side in the drawing has thereon a first-level wiring M1 and this first-level wiring M1 extends to the adjacent memory cell region (here, the memory cell region located on the upper side in this drawing). The first-level wirings M1 extending even to the adjacent memory cell regions have thereon second plugs P2 (FIG. 16), respectively.

The remaining first plugs P1 other than the shared plug SP1 have, on the first plugs P1, first-level wirings (pad regions) M1 and the first-level wirings have thereon the second plugs P2 (FIG. 16).

As shown in FIG. 17, the second plug P2 on the L-shaped first-level wiring M1 (that is, the first-level wiring M1 which couples the n type back gate region nBG below the active region (semiconductor region 3) AcP1 and the p type back gate region pBG) and the second plug P2 on the first-level wiring M1 to be coupled to the shared source/drain region of Dr2 and Acc2 are coupled to each other via a second-level wiring M2.

In addition, the second plug P2 on the inverted L-shaped first-level wiring M1 (that is, the first-level wiring M1 which couples the n type back gate region nBG below the active region (semiconductor region 3) AcP2 and the p type back gate region pBG) and the second plug P2 on the first-level wiring M1 to be coupled to the shared source/drain region of Dr1 and Acc2 are coupled to each other via a second-level wiring M2. These second-level wirings M2 have thereon third plugs P3, respectively.

The remaining second plugs P2 have thereon second-level wirings (pad regions) M2, respectively, and the second-level wirings have thereon the third plugs P3 (FIG. 17).

Among the third plugs, a third plug P3 to be coupled to the shared gate electrode G of Lo and Dr1 has, on this third plug, a third-level wiring M3, while a third plug P3 to be coupled to the shared gate electrode G of Lo2 and Dr2 has, on this third plug, a third-level wiring M3 (FIG. 18). These third-level wirings M3 are coupled to each other by a word line (WL, not shown in FIG. 18) which is an upper-level wiring.

A third plug P3 to be coupled to the source/drain region of Dr1 on the upper side in FIG. 10 has, on this third plug, a grounding potential line (VSS), which is a third-level wiring M3, while a third plug P3 to be coupled to the source/drain region of Dr2 on the lower side in the drawing has, on this third plug, a grounding potential line (VSS) which is a third-level wiring M3.

A third plug P3 to be coupled to the source/drain region of Acc1 on the lower side in the drawing has, on this third plug, a bit line (BL) which is a third-level wiring M3. A third plug P3 to be coupled to the source/drain region of Acc2 on the upper side of the drawing has, on this third plug, a bit line (/BL) which is a third level wiring M3.

A third plug P3 to be coupled to the source/drain region of Lo1 shown in FIG. 10 on the upper side of the drawing and a third plug P3 to be coupled to the source/drain region of Lo2 on the lower side of the drawing have, on these third plugs, a power supply potential line (Vdd) which is a third-level wiring M3 (FIG. 18). These third-level wirings M3 extend in the Y direction as shown in FIG. 18.

Thus, electrical coupling of the first plugs P1 shown in FIG. 10 and the like via the first to third-level wirings (M1 to M3) makes it possible to actualize the coupling state of the transistors shown in FIG. 1 and moreover, achieve electrical coupling between the gate electrode G of each of the four transistors (Dr1, Lo1, Lo2, and Dr2) shown in FIG. 10 and the back gate region (B) and apply a predetermined potential to the well region (well).

As described above, FIGS. 16 to 18 show one example of the wiring layout capable of actualizing the coupling state between first plugs P1 shown in FIG. 15. Various modifications can be made to this wiring layout.

Figure 19:
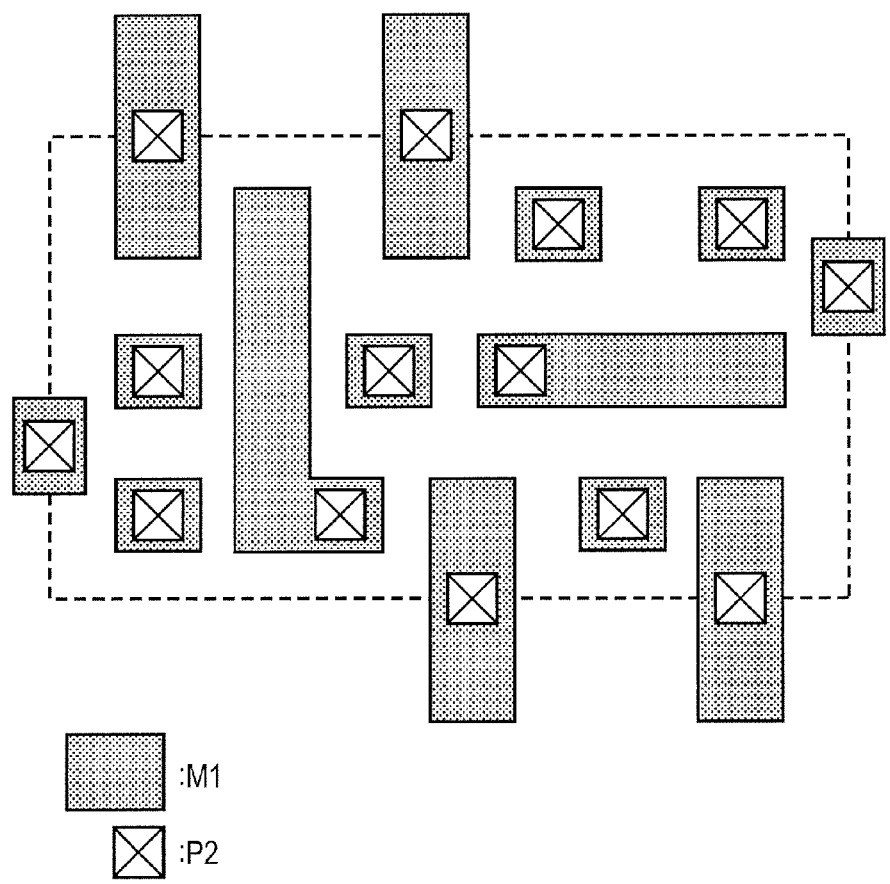
FIG. 19 is a plan view showing another configuration of the SRAM memory cell according to the first embodiment.
Figure 20:
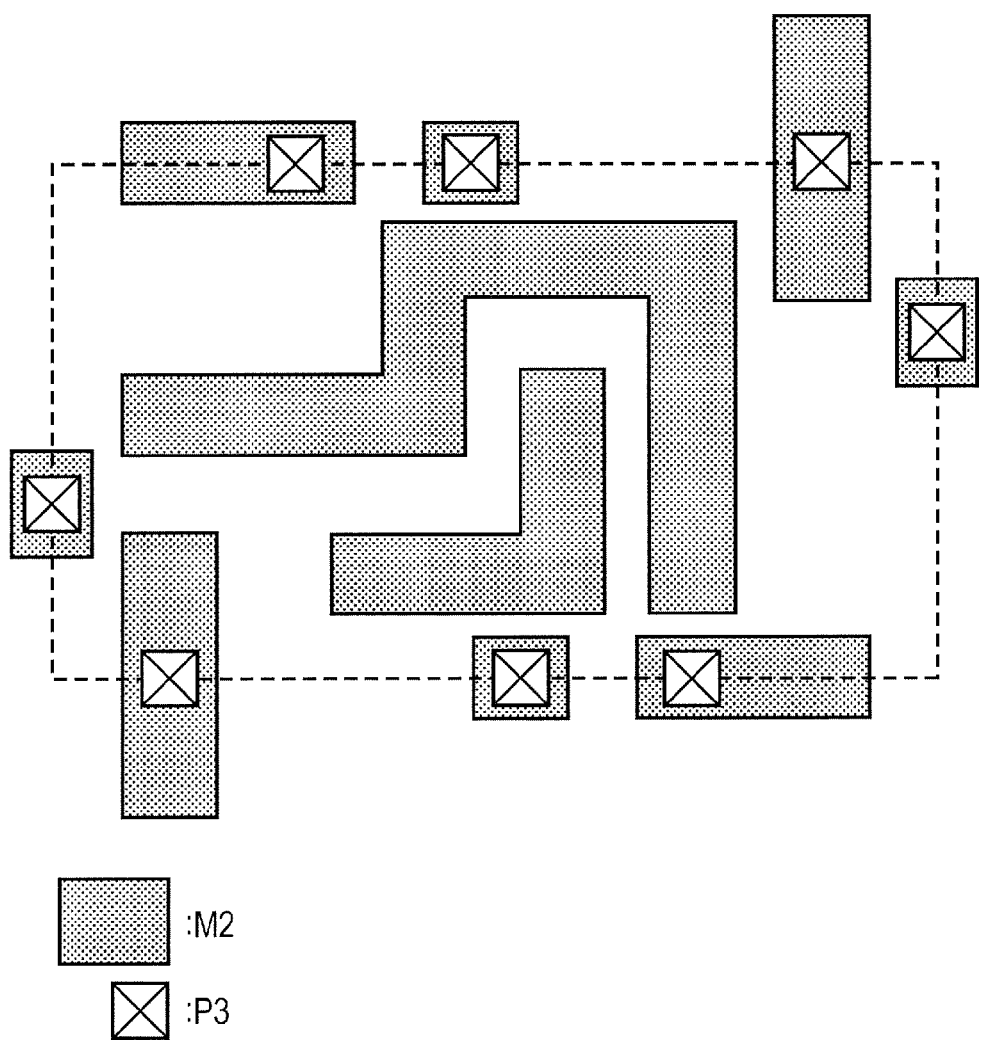
FIG. 20 is a plan view showing the another configuration of the SRAM memory cell according to the first embodiment.
Figure 21:
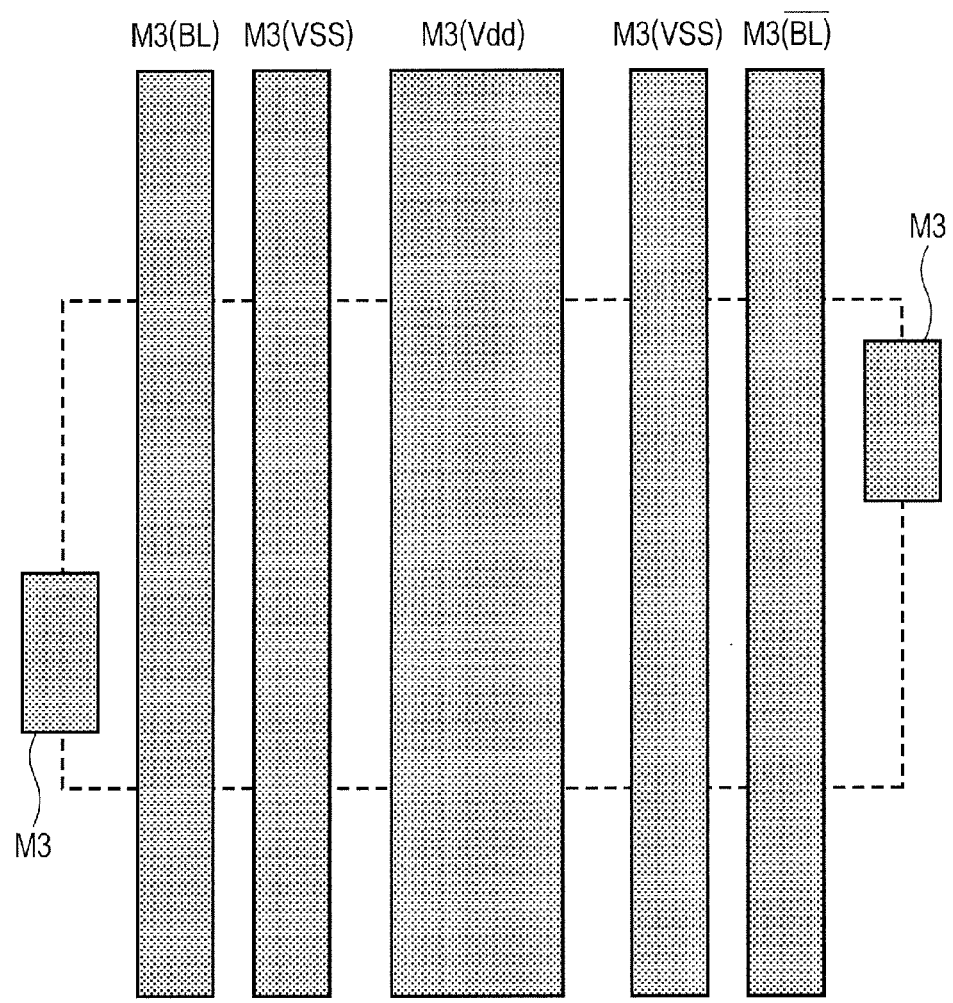
FIG. 21 is a plan view showing the another configuration of the SRAM memory cell according to the first embodiment.

For example, another wiring layout is shown in FIGS. 19 to 21. FIGS. 19 to 21 are plan views showing another configuration of the SRAM memory cell of the present embodiment. FIG. 19 shows the arrangement of the first-level wiring M1 and the second plug P2. FIG. 20 shows the arrangement of the second-level wiring M2 and the third plug P3. FIG. 21 shows the arrangement of the third-level wiring M3. A substantially rectangular region shown by a broken line in FIGS. 19 to 21 is a memory cell region. By overlapping the plan views of FIG. 10 and FIGS. 19 to 21 with each other at their memory cell regions, the positional relationship of the patterns indicated in each drawing can be made clear. The electrical coupling relationship is similar to that described in detail in FIG. 1, FIG. 15 and the like so that a detailed description on the layout of the patterns in FIGS. 19 to 21 is omitted here.

Compared with the wiring layout shown in FIGS. 19 to 21, the layout shown in FIGS. 16 to 18 is excellent in symmetry of wirings, facilitates design and manufacture, and contributes to improvement in the characteristics of a device. For example, the pattern shape shown in FIG. 10 and FIGS. 16 to 18 is arranged symmetrically with respect to the center point of the memory cell region.

[Configuration of Memory Cell Array]

Figure 22:
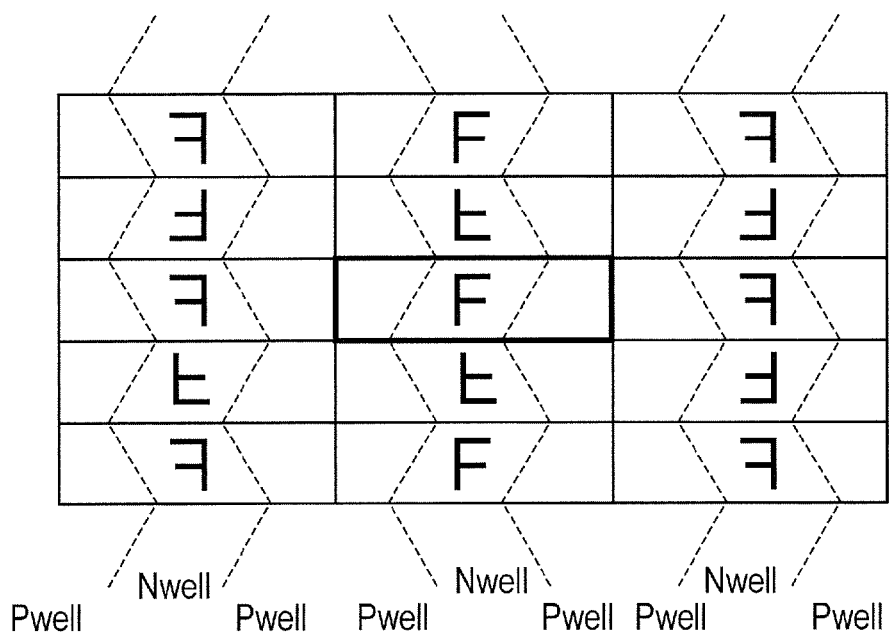
FIG. 22 is a plan view showing the concept of a SRAM memory cell array according to the first embodiment.

FIG. 22 is a plan view showing the concept of the SRAM memory cell array of the present embodiment. As shown in FIG. 22, supposing that the memory cell region described referring to FIG. 10, FIG. 15 and the like is represented by "F", memory cell regions are, in a memory cell array, repeatedly arranged in a perpendicular direction (Y direction) in this drawing while placing them symmetrically with respect to a line (X axis) extending in the X direction (reflected with respect to the X axis). In addition, the memory cell regions are repeatedly arranged in a horizontal direction (X direction) in the drawing while placing them symmetrically with respect to a line (Y axis) extending in the Y direction (reflected with respect to the Y axis).

The layout and cross-sectional structure of the memory cell region (rectangular region surrounded by a broken line) indicated with "F" are as described in detail referring to plan views of FIG. 10, FIG. 15 and the like and cross-sectional views of FIG. 11 and FIG. 12. In memory cell regions other than those represented by "F", the shape of each pattern is provided symmetrically with respect to a line extending in the X direction or Y direction.

As described above, each well region (Pwell, Nwell, Pwell) in the memory cell region extends in the Y direction. A P well outside the memory cell region is in contact with a P well in an adjacent memory cell region so that the p well region (Pwell) and n well region (Nwell) seem to be arranged alternately in the X direction when viewed as an entire memory cell array. The p well region Pwell extends mainly in the Y direction, but extends in a zigzag manner with a predetermined width.

[Description on Tap Cell Region]

As described referring to FIG. 22, a plurality of cell regions is arranged in the memory cell array. In the memory cell array, a tap cell region (power feed region) is provided. Via the tap cell region, a predetermined potential (for example, grounding potential VSS or power supply potential Vdd) is supplied to each well region.

Figure 23:
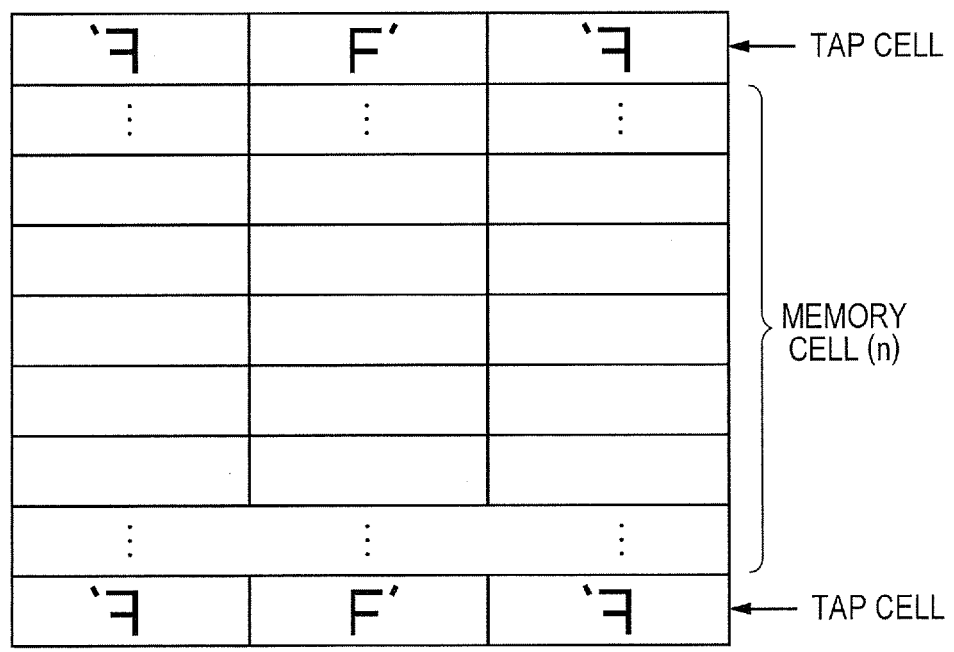
FIG. 23 is a plan view conceptually showing the position of the tap cell region in the SRAM memory cell array according to the first embodiment.

FIG. 23 conceptually shows the position of the tap cell region in the SRAM memory cell array of the present embodiment. As shown in this drawing, this tap cell (power feed cell) is placed per n pieces of memory cell regions arranged in the Y direction and it is repeatedly arranged in the X direction while placing it symmetrically with respect to a line extending in the Y direction. In other words, one tap cell region is placed for an array region made of m×n memory cell regions and this tap cell region has a plurality of tap cells in the X direction. In FIG. 23, one tap cell of tap cells arranged in the X direction is shown by "F".

Figure 24:
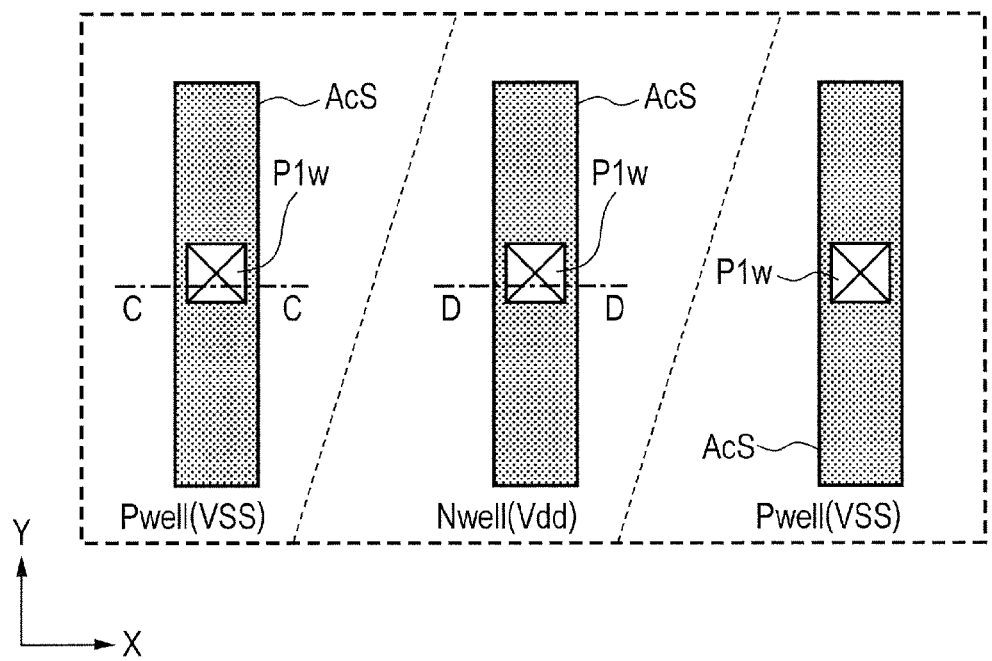
FIG. 24 is a plan view showing the configuration of a tap cell of the SRAM according to the first embodiment.
Figure 25:
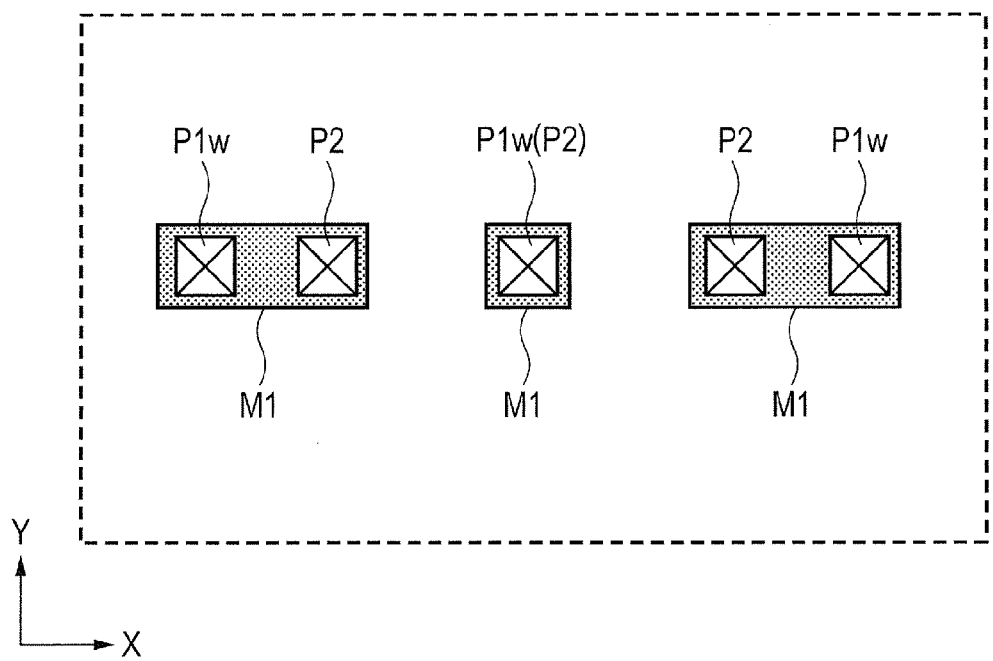
FIG. 25 is a plan view showing the configuration of the tap cell of the SRAM according to the first embodiment.
Figure 26:
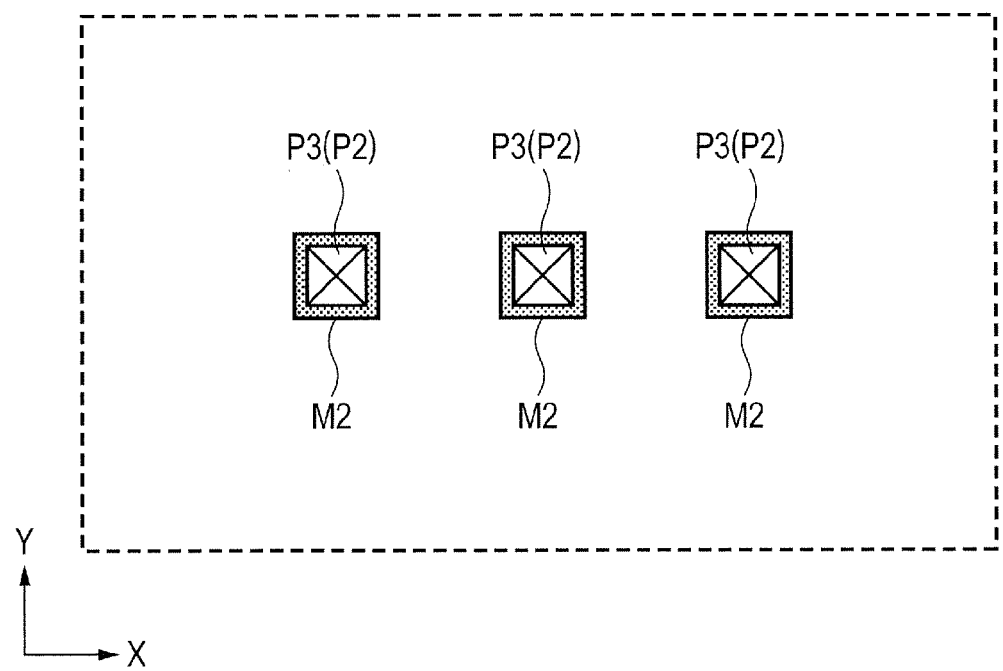
FIG. 26 is a plan view showing the configuration of the tap cell of the SRAM according to the first embodiment.

FIGS. 24 to 27 are plan views showing the configuration of the tap cell (F') of the SRAM of the present embodiment. FIG. 24 shows the arrangement of an active region (power feed portion, potential application portion) AcS and a first plug P1w. FIG. 25 shows the arrangement of a first plug P1w, a first-level wiring M1, and a second plug P2. FIG. 26 shows the arrangement of the second plug P2, a second-level wiring M2, and a third plug P3.

Figure 27:
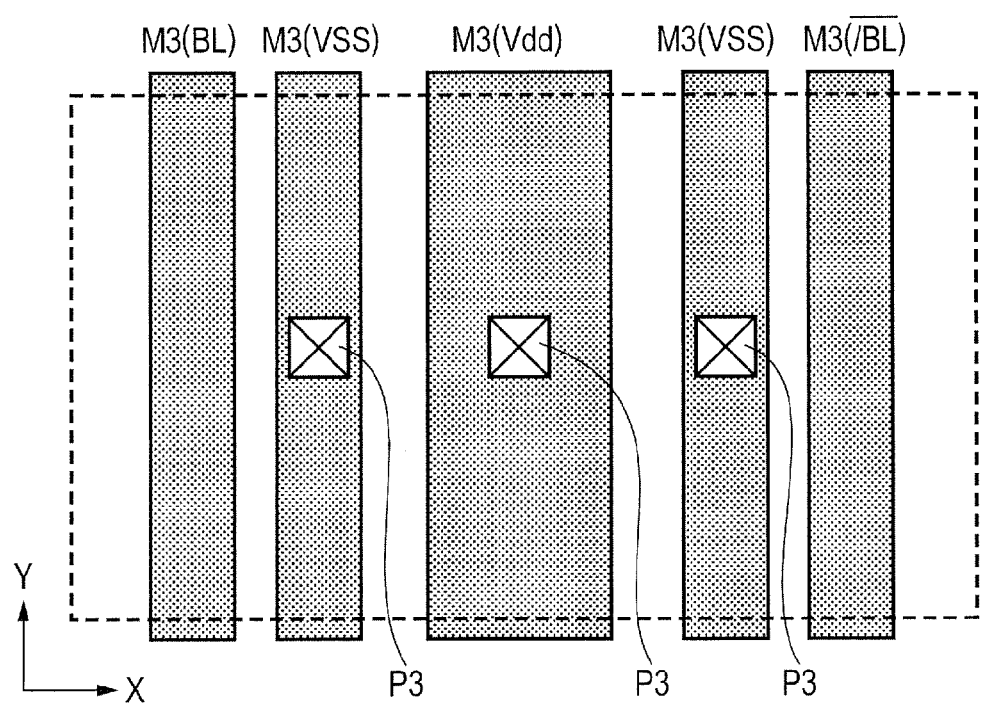
FIG. 27 is a plan view showing the configuration of the tap cell of the SRAM according to the first embodiment.

FIG. 27 shows the arrangement of the third plug P3 and a third-level wiring M3. In these drawings, by overlapping the plan views with each other at a predetermined pattern, the positional relationship of the patterns indicated in each drawing can be made clear. It is to be noted that a rectangular region surrounded by a broken line corresponds to one tap cell and it has, for example, a size equal to that of the memory cell region. In FIG. 24, the cross-sectional portion (C-C) of the first plug P1w to be coupled to the p well region Pwell located below the active region AcS corresponds to FIG. 13. In FIG. 24, the cross-sectional portion (D-D) of the first plug P1w to be coupled to the n well region Nwell located below the active region AcS corresponds to FIG. 14.

In the memory cell region, each well region (Pwell, Nwell, Pwell) extending in the Y direction also extends in the Y direction in the tap cell shown in FIG. 24 and the p well region (Pwell), n well region (Nwell) and p well region (Pwell) are arranged side by side in the X direction.

On the tap cell, three active regions AcS are arranged side by side in the X direction. These active regions (AcS) have therebetween an element isolation region (STI). In other words, by the element isolation region (STI), the active regions (AcS) are partitioned (refer to FIG. 13 and FIG. 14). As described above, the active region (AcS) has therebelow a back gate region BG via an insulating layer BOX (refer to FIG. 13 and FIG. 14). This back gate region BG is also partitioned and isolated by the element isolation region (STI). The back gate region BG has therebelow well regions (Pwell, Nwell, and Pwell) as described above, but these well regions extend without interruption in the Y direction below the element isolation region STI.

In other words, the depth DAcS of the active region AcS (semiconductor region 3) is smaller than the depth DSTI of the element isolation region STI (DAcS<DSTI). The depth DBG of the back gate region BG is smaller than the depth DSTI of the element isolation region STI (DBG<DSTI). The depth Dwell of the well region is greater than the depth DSTI of the element isolation region STI (Dwell>DSTI).

As is also apparent from FIGS. 13 and 14, the first plug P1w reaches even each well region and via this first plug P1w, a predetermined potential (Vdd, Vss) is applied to the well region. In other words, via this first plug P1w, each well region is fixed at a predetermined potential (Vdd, VSS).

More specifically, each first plug P1W has thereon a first-level wiring M1. The first-level wiring M1 has thereon a second plug P2 (FIG. 25). This second plug P2 has thereon a second-level wiring M2 (pad region) (FIG. 26) and this second plug P2 has thereon a third-level wiring M3 (FIG. 27). Of the third-level wirings M3, the grounding potential line (VSS) is a grounding potential line described in the column of "configuration of memory cell". Of the third-level wirings M3, the power supply potential line (Vdd) is a power supply potential line described in the column of "configuration of memory cell".

Incidentally, on the tap cell, a bit line (third-level wiring M3 (BL), third-level wiring M3 (/BL)) described in the column of "configuration of memory cell" extends (FIG. 27).

A dummy gate electrode (dummy gate wiring, dummy gate) extending in the X direction may be placed on the element isolation region STI of the tap cell. The term "dummy gate electrode" means a conductive film which is provided on the element isolation region (STI) but cannot operate as a transistor. This conductive film is made of the same material in the same step as those of the gate electrode G.

When this dummy gate electrode is provided, unevenness due to the gate electrodes is repeated at a constant interval, resulting in improvement in the regularity of the layout. This results in the manufacture of a semiconductor device having improved characteristics while lessening variation in manufacture.

In such a manner, it is possible, to couple the n well region (Nwell) to the power supply potential line (Vdd) and couple the p well region (Pwell) to the grounding potential line (VSS) by making use of the tap cell. Each pattern shown in FIGS. 24 to 27 is only an example and another layout may be employed. For example, the active region AcS of the tap cell may have a shape similar to that of the active region (AcP1, AcN1, AcN2, AcP2) of the memory cell.

[Formation Step of Memory Cell, Etc.]

Figure 28:
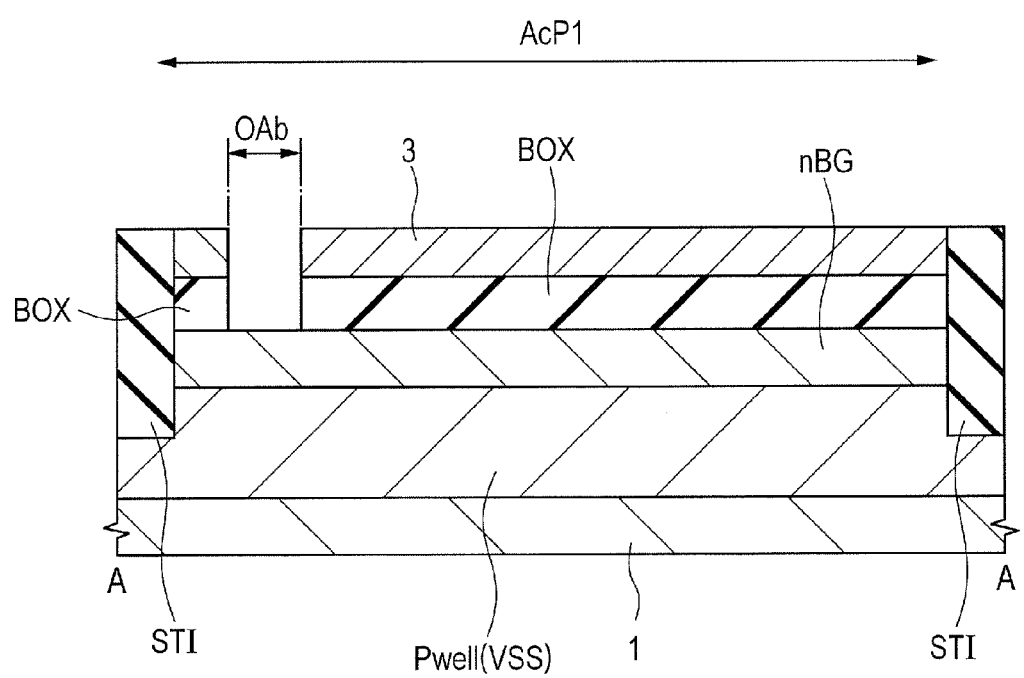
FIG. 28 is a cross-sectional view showing a manufacturing step of the SRAM according to the first embodiment.
Figure 30:
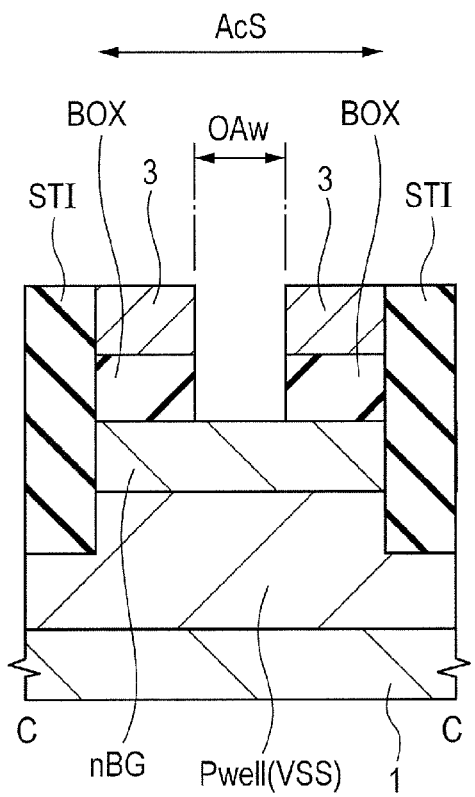
FIG. 30 is a cross-sectional view showing a manufacturing step of the SRAM according to the first embodiment.
Figure 31:
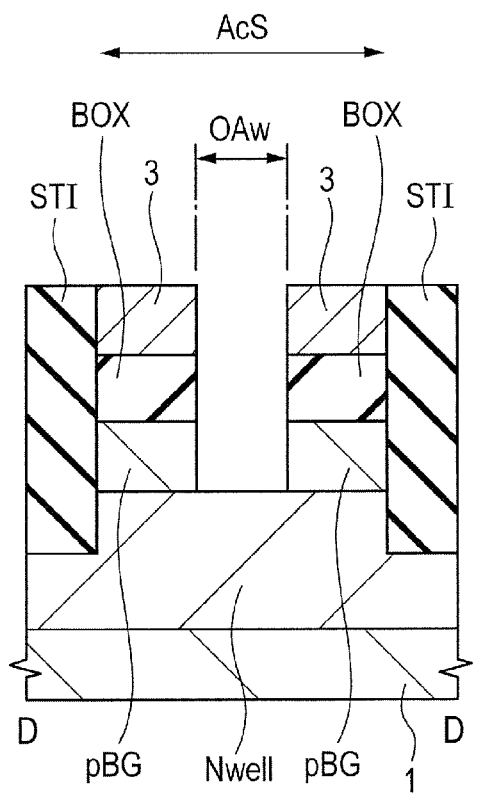
FIG. 31 is a cross-sectional view showing a manufacturing step of the SRAM according to the first embodiment.
Figure 32:
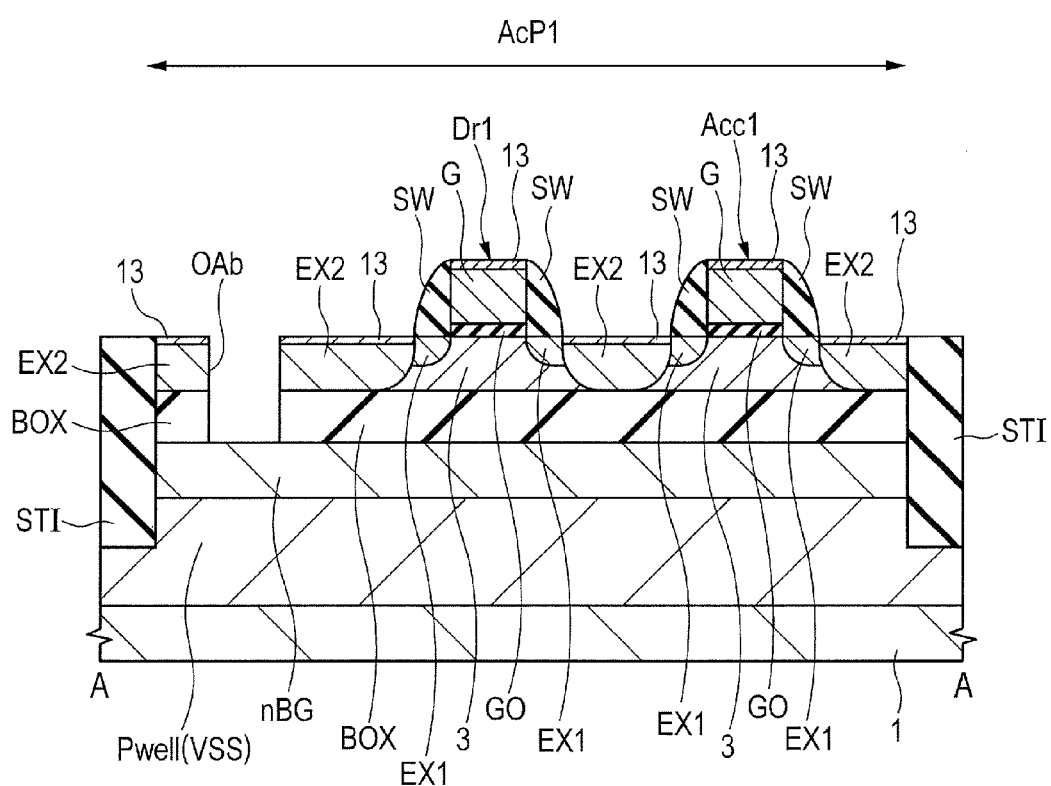
FIG. 32 is a cross-sectional view showing a manufacturing step of the SRAM according to the first embodiment.
Figure 33:
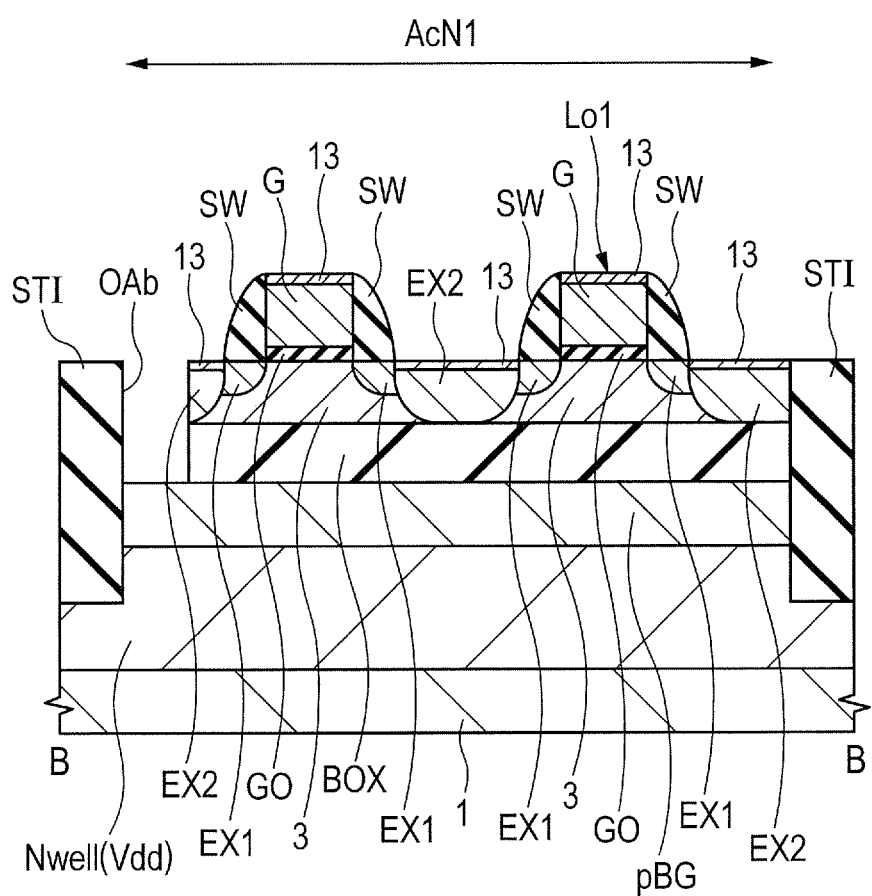
FIG. 33 is a cross-sectional view showing a manufacturing step of the SRAM according to the first embodiment.
Figure 34:
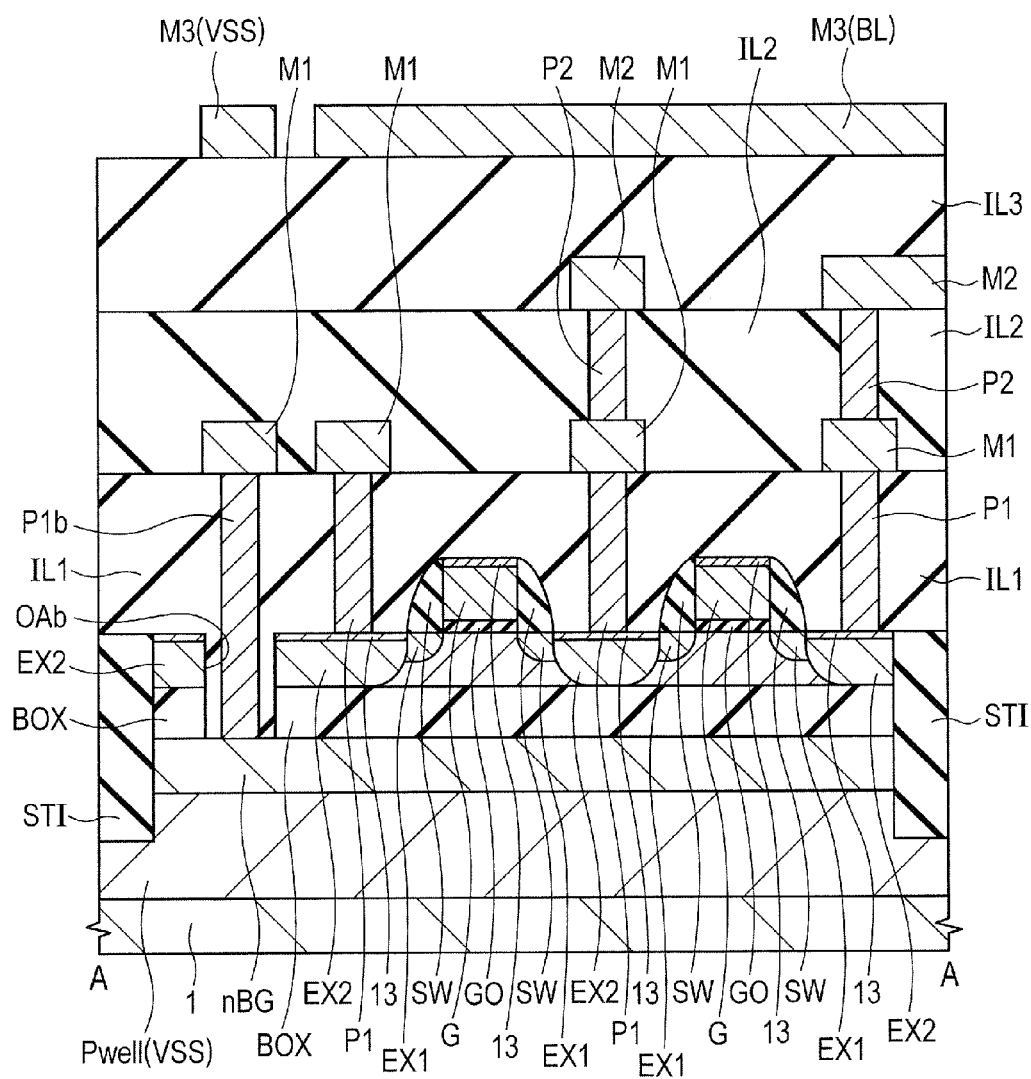
FIG. 34 is a cross-sectional view showing a manufacturing step of the SRAM according to the first embodiment.
Figure 35:
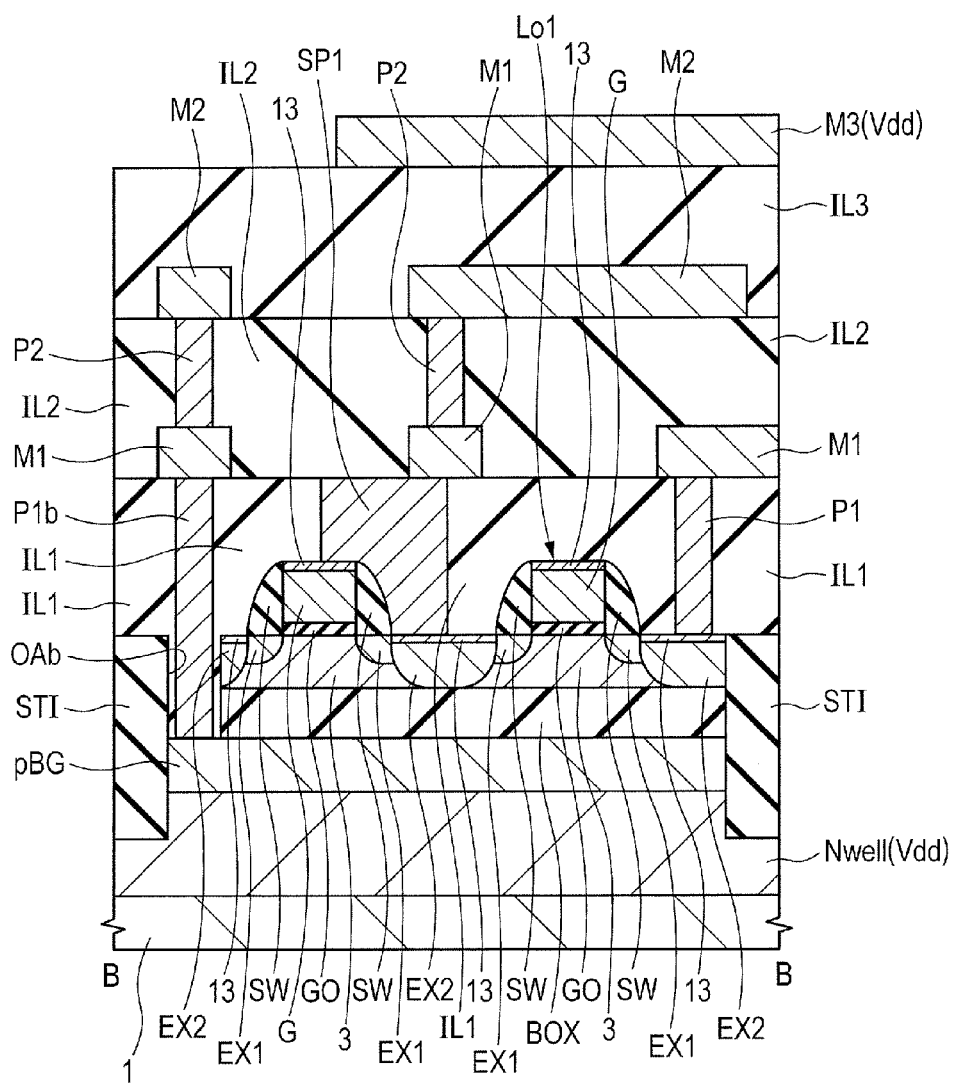
FIG. 35 is a cross-sectional view showing a manufacturing step of the SRAM according to the first embodiment.
Figure 36:
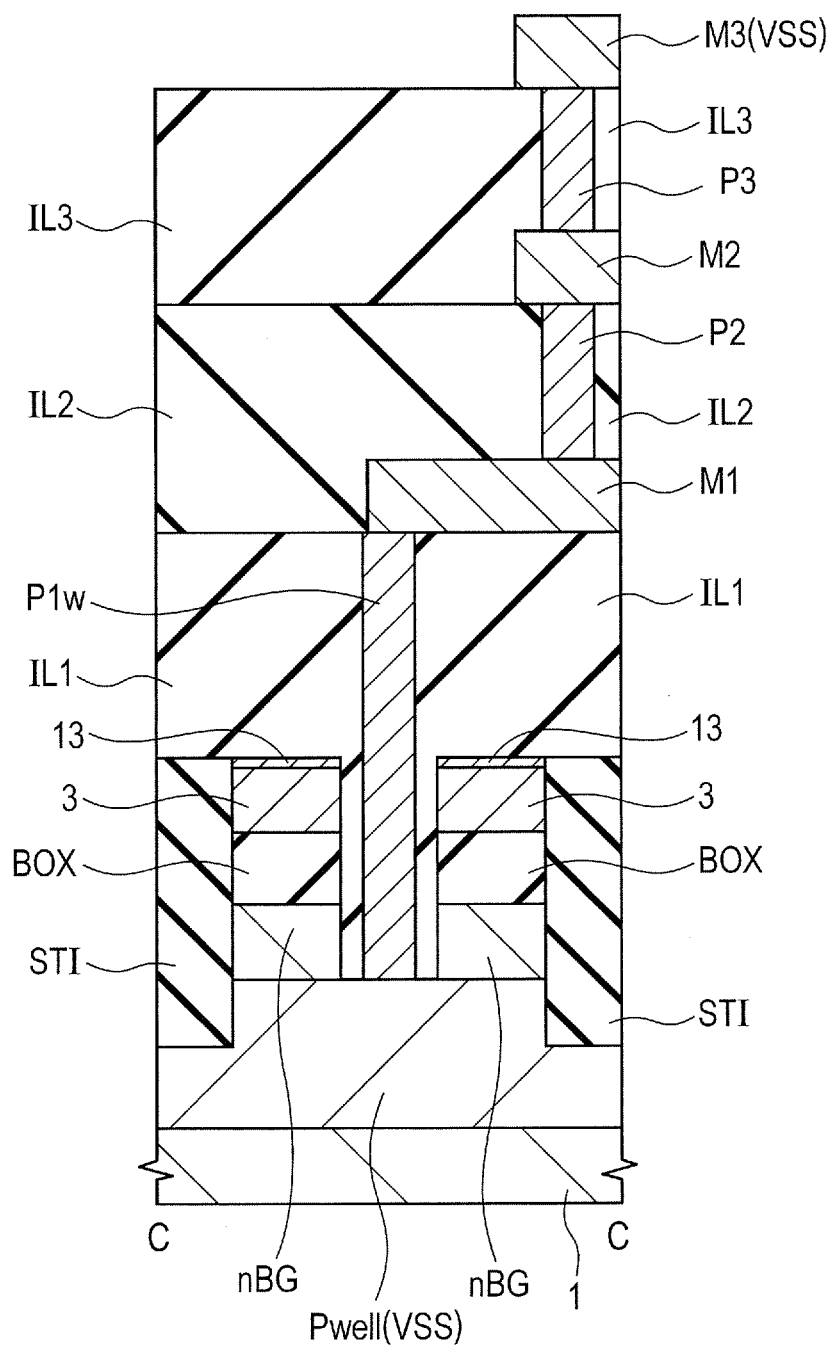
FIG. 36 is a cross-sectional view showing a manufacturing step of the SRAM according to the first embodiment.
Figure 37:
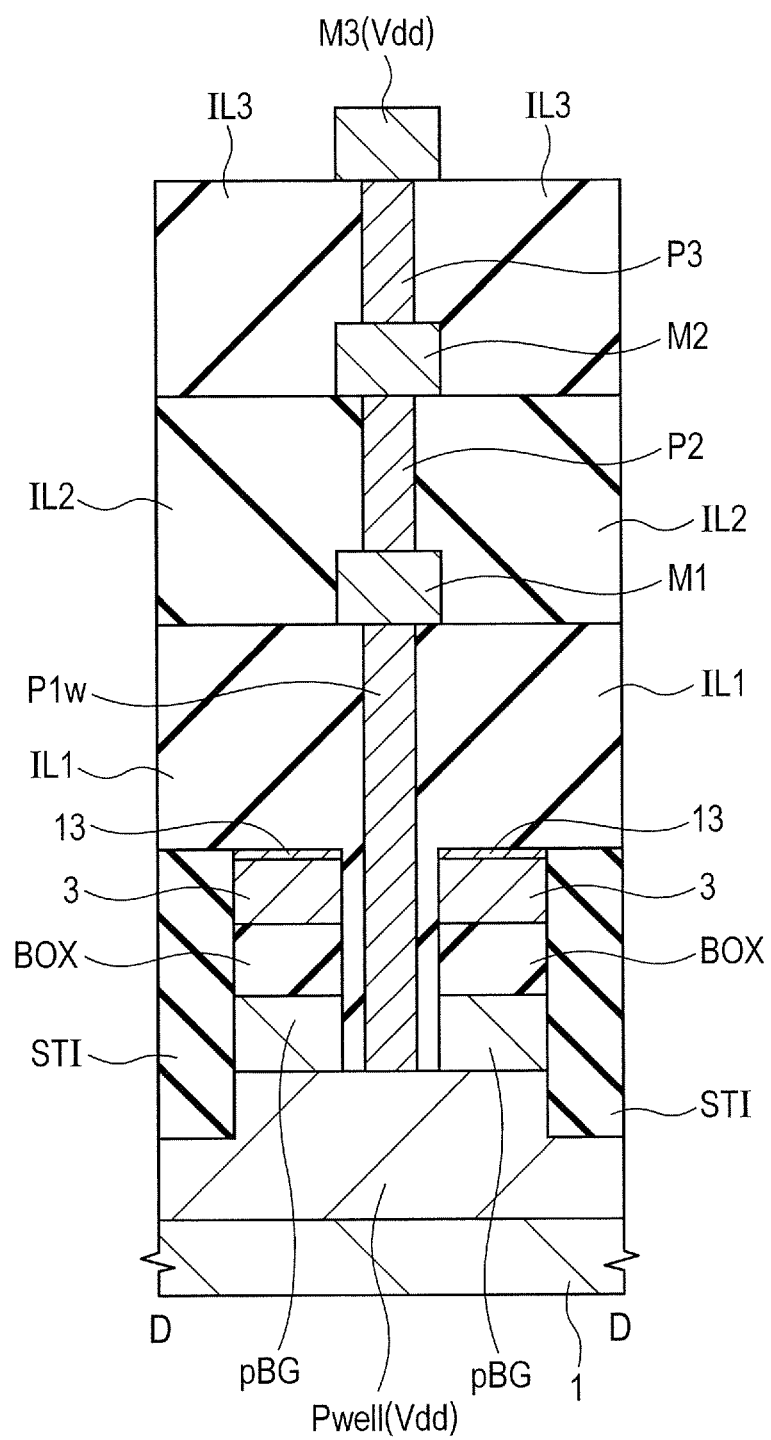
FIG. 37 is a cross-sectional view showing a manufacturing step of the SRAM according to the first embodiment.

Next, manufacturing steps of the SRAM memory cell and the like of the present embodiment will be described and the configuration of the SRAM memory cell and the like of the present embodiment will be made clearer while referring to the cross-sectional views shown in FIGS. 28 to 37. FIGS. 28 to 37 are cross-sectional views showing the manufacturing steps of the SRAM of the present embodiment. FIGS. 28 to 31 show the steps until the formation of an opening portion. FIG. 28 corresponds to the A-A cross-section of FIG. 10, FIG. 29 corresponds to the B-B cross-section of FIG. 10, FIG. 30 corresponds to the C-C cross-section of FIG. 24, and FIG. 31 corresponds to D-D cross-section of FIG. 24. FIGS. 32 and 33 show the steps until the formation of a transistor. FIG. 32 corresponds to the A-A cross-section and FIG. 33 corresponds to the B-B cross-section. FIGS. 34 to 37 show the steps until the formation of a third-level wiring. FIG. 34 corresponds to the A-A cross-section, FIG. 35 corresponds to the B-B cross-section, FIG. 36 corresponds to the C-C cross-section, and FIG. 37 corresponds to the D-D cross-section.

As shown in FIGS. 28 to 31, an SOI substrate is prepared. This SOI substrate has, as described above, a support substrate 1, an insulating layer BOX, and a semiconductor region (element formation region) 3 lying thereon. The support substrate 1 is, for example, a single crystal silicon substrate. The insulating layer BOX is, for example, a silicon oxide film and it has a film thickness of, for example, from about 4 to 20 nm. The semiconductor region 3 is, for example, a single crystal silicon layer and has a thickness of, for example, from about 4 to 20 nm.

Next, an element isolation region STI is formed in the SOI substrate. By this element isolation region STI, an active region (Ac) is partitioned.

This element isolation region STI can be formed using an STI (shallow trench isolation) process. Described specifically, an element isolation trench reaching the support substrate 1 is formed in the SOI substrate by using photolithography and etching. The element isolation trench has a depth of, for example, from about 200 nm to 500 nm. An insulating film such as silicon oxide film is formed on the semiconductor substrate to fill the element isolation trench. This silicon oxide film is formed using CVD (Chemical Vapor Deposition) or the like and it has a thickness of, for example, from about 300 nm to 700 nm. Then, an unnecessary portion of the silicon oxide film formed on the semiconductor substrate is removed by chemical mechanical polishing (CMP). As a result, an element isolation region STI having the silicon oxide film buried only in the element isolation trench can be formed. This element isolation trench has a depth of, for example, from about 200 nm to 500 nm. In the silicon oxide film formation step, SA-CVD (Sub-Atmospheric Chemical Vapor Deposition) or HDP-CVD (High Density Plasma Chemical Vapor Deposition) may be employed. Using such a process improves the burying property in the element isolation trench. When the element isolation trench is a fine and high-aspect-ratio one, the burying property can be improved further by using a film stack obtained by forming a film by HDP-CVD on a film formed by SA-CVD. Alternatively, after the CMP step, the upper portion of the element isolation region STI may be etched using hydrofluoric acid to improve its flatness.

Next, a p well region (Pwell, semiconductor region) containing p type impurities (for example, boron) and an n well region (Nwell, semiconductor region) containing n type impurities (for example, phosphorus or arsenic) are formed in the support substrate 1. The p well region (Pwell) can be formed, for example, by introducing p type impurities into the support substrate 1 by using ion implantation. For example, boron (B) is ion-implanted at a concentration of from $5\times10^{12}$/cm$^2$ to $5\times10^{13}$/cm$^2$ to form a p well region (Pwell) having an impurity concentration of from $5\times10^{17}$/cm$^3$ to $5\times10^{18}$/cm$^3$. The term "impurity concentration" as used herein means the maximum concentration in the corresponding region. The n well region (Nwell) can be formed, for example, by introducing n type impurities into the support substrate 1 by using ion implantation. For example, phosphorus (P) or arsenic (As) is ion-implanted at a concentration of from $5\times10^{12}$/cm$^2$ to $5\times10^{13}/cm^2$ to form an n well region (Nwell) having an impurity concentration of from $5\times10^{17}/cm^3$ to $5\times10^{18}/cm^3$.

When the impurities are introduced, after formation of a screen film (not illustrated) such as a silicon oxide film on the surface of the semiconductor region (element formation region) 3, ion implantation is conducted via this screen film. In a region not requiring ion implantation, needless to say, a mask film is formed as needed to prevent introduction of impurities into this region. Ion implantation of impurities is conducted while targeting an ion range at a position deeper than the element isolation region STI. When the ion range is thus adjusted, due to the diffusion of the impurities occurring thereafter, the well region has an upper end above the bottom portion of the element isolation region STI and spreads to a position deeper than the bottom portion of the element isolation region STI. If the ion range cannot be adjusted by one ion implantation, ion implantation may be conducted multiple times while changing the ion implantation energy. The term "ion range" means, when impurities (ions) enter a material to be implanted (here, support substrate 1), an average distance of impurities (ions) until they stop completely in the material. As a result, these well regions have a bottom portion at a position deeper than the element isolation region STI and each well region extends in the Y direction with a predetermined depth, while extending without interruption below the element isolation region STI (refer to FIG. 10).

Next, a p type back gate region pBG containing p type impurities (for example, boron) and an n type back gate region nBG containing n type impurities (for example, phosphorus or arsenic) are formed at a relatively shallow position in the support substrate 1, that is, between the bottom portion of the well region and the insulating layer BOX. The p type back gate region pBG can be formed by introducing p type impurities into the support substrate 1, for example, by using ion implantation. For example, boron or indium (In) is ion-implanted at a concentration of $5\times10^{13}/cm^2$ to $1\times10^{15}/cm^2$. The n type back gate region nBG can be formed by introducing n type impurities into the support substrate 1, for example, by using ion implantation. For example, phosphorus, arsenic, or antimony (Sb) is ion-implanted at a concentration of $5\times10^{13}/cm^2$ to $1\times10^{15}/cm^2$. As descried above, the bottom portion of these back gate regions BG lies at a position shallower than the bottom of the element isolation region STI and each back gate region BG is isolated by the element isolation region STI.

The depth of the back gate region can be adjusted by controlling the implantation energy in ion implantation. The implantation energy is controlled by targeting the ion range to a position shallower than the depth of the element isolation region STI so that even by the diffusion of impurities thereafter, the bottom portion of the back gate region comes to the position shallower than the bottom portion of the element isolation region STI.

Here, after formation of the well region, the back gate region is formed, and vice versa. It is preferred to adjust the ion implantation conditions as described above to prevent implantation of impurities including the well region or back gate region into the semiconductor region 3. In other words, it is preferred not to implant impurities into the semiconductor region 3 so that the channel region of the transistor becomes non-doped. Although impurities for adjusting a threshold voltage may be implanted into this semiconductor region 3 (region to be a channel), in this case, the transistor characteristics vary greatly due to a variation in the impurity concentration as described above (refer to FIG. 7). When the channel region is made non-doped, on the other hand, a variation in the transistor characteristics can be reduced.

Figure 29:
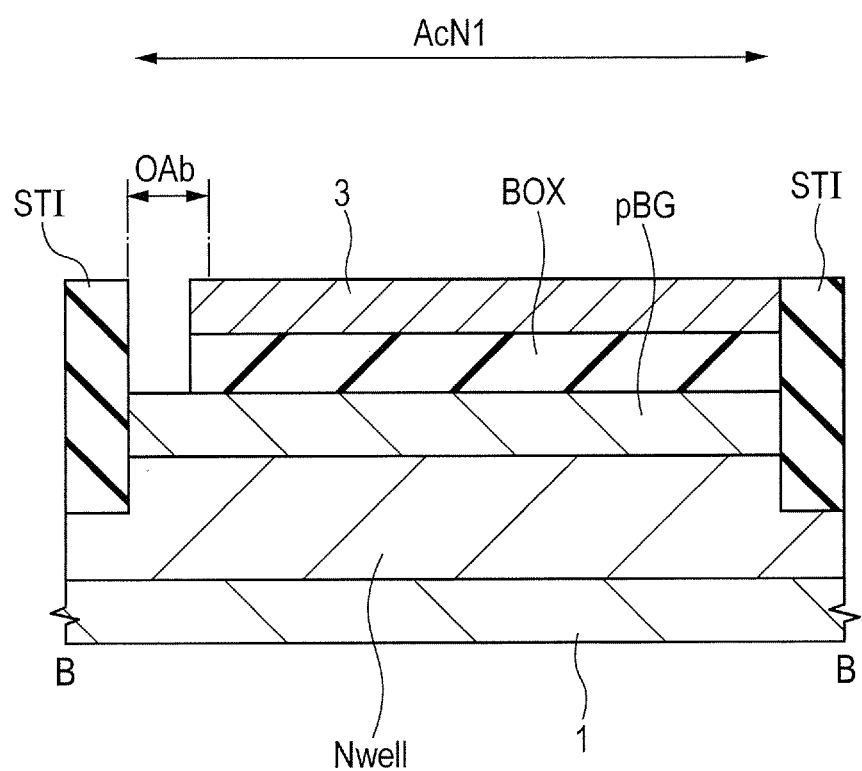
FIG. 29 is a cross-sectional view showing a manufacturing step of the SRAM according to the first embodiment.

Next, an opening portion OAb is formed in the formation region of a first plug P1b. As shown in FIG. 28, the semiconductor region 3 and the insulating layer BOX are removed from the formation region of a first plug P1b to expose the n type back gate region nBG. In addition, as shown in FIG. 29, the semiconductor region 3 and the insulating layer BOX are removed from the formation region of a first plug P1b to expose the p type back gate region pBG.

In a tap cell, an opening portion OAw is formed in the formation region of a first plug P1w. Described specifically, as shown in FIG. 30, a semiconductor region 3, an insulating layer BOX, and an n type back gate region nBG are removed from the formation region of a first plug P1w to expose a p well region Pwell. In addition, as shown in FIG. 31, the semiconductor region 3, the insulating layer BOX, and the p type back gate region pBG are removed from the formation region of a first plug P1w to expose an n well region Nwell.

The well region (Nwell or Pwell) and the back gate region (nBG or pBG) may be formed after formation of the opening portions OAw and OAb.

Next, as shown in FIG. 32 and FIG. 33, each transistor is formed on the main surface of the semiconductor region 3. First, a gate insulating film GO is formed on the main surface of the active region (Ac). As this gate insulating film GO, for example, a silicon oxide film can be used. For example, by using thermal oxidation, a silicon oxide film having a thickness of, for example, from about 1.0 nm to 2.5 nm is formed. Instead, CVD may be employed for the formation of the silicon oxide film. A silicon oxynitride film obtained by introducing from about 3 to 10% of nitrogen into a silicon oxide film by using a nitrogen plasma process may also be used. The gate insulating film GO may be comprised of another insulating film (for example, high dielectric constant film). The gate insulating film GO may be comprised of a film stack of a silicon oxide film and a high dielectric constant film (high-k film) thereon. In this case, after formation of a silicon oxide film having a thickness of from about 0.5 nm to 1.5 nm, for example, by thermal oxidation, a hafnium oxide film ($HfO_2$ film) or the like having a thickness of from about 0.5 nm to 2.0 nm is formed by using CVD. Alternatively, the composition of the gate insulating film GO may be changed with the region.

Next, a gate electrode G made of a conductive film is formed on the gate insulating film GO. As the gate electrode G, for example, a polycrystalline silicon film can be used. For example, the gate electrode G is formed by depositing a polycrystalline silicon film having a thickness of, for example, from about 50 nm to 150 nm on the gate insulating film GO by using CVD or the like and then patterning the film. For example, with a mask film (not shown) such as silicon nitride film as a mask, the conductive film is etched. As the gate electrode G, a metal film may be employed. Alternatively, the gate electrode G may be composed of a film stack of a polycrystalline silicon film and a metal film. The material of the gate electrode G can be selected as needed, depending on the intended transistor characteristics.

Next, an n type lightly doped impurity region EX1 is formed in each of the active regions AcP1 and AcP2 on both sides of the gate electrode G. This n type lightly doped impurity region EX1 can be formed by introducing an n type impurity into each of the active regions (AcP1 and AcP2) by ion implantation, while using the gate electrode G (including the upper silicon nitride film) as a mask. Then, a p type lightly doped impurity region EX1 is formed in each of the active regions AcN1 and AcN2 on both sides of the gate electrode G. The p type lightly doped impurity region EX1 can be formed by introducing p type impurities into each of the active regions (AcN1 and AcN2) by ion implantation while using the gate electrode G as a mask.

Next, a sidewall SW is formed on the side wall on both sides of the gate electrode G. This sidewall SW is made of, for example, a silicon nitride film. It can be formed, for example, by depositing an insulating film such as silicon nitride film on the gate electrode G by CVD and carrying out anisotropic etching to leave the insulating film on the side wall of the gate electrode G as a sidewall SW. When this sidewall SW is formed, the insulating film deposited as the sidewall may remain also on the side wall of each of the opening portions OAb and OAw (not shown). It does not pose any problem insofar as the bottom portion is exposed from each of the opening portions (OAb and OAw). In other words, each of the opening portions (OAb and OAw) is formed with a size large enough to prevent complete filling even if the insulating film deposited as the sidewall remains. Thus, remaining of the insulating film in the opening portion does not pose any problem insofar as the bottom portion is exposed from each of the opening portions (OAb and OAw). Rather, remaining of the insulating film deposited as the sidewall on the opening portion is preferred because the side wall of the opening portion can be protected with the insulating film.

Next, an n type heavily doped impurity region EX2 is formed in each of the active regions (AcP1 and AcP2) on both sides of a combination of the gate electrode G (including a silicon nitride film on the upper portion) and the sidewall SW. This n type heavily doped impurity region EX2 can be formed by introducing n type impurities (for example, phosphorus or arsenic). For example, phosphorus, arsenic, or the like is ion-implanted at a concentration of from $1 \times 10^{14}/cm^2$ to $1 \times 10^{16}/cm^2$. In addition, a p type heavily doped impurity region EX2 is formed in each of the active regions (AcP1 and AcP2) on both sides of the combination. This p type heavily doped impurity region EX2 can be formed by introducing p type impurities (for example, boron) by ion implantation with the combination as a mask. For example, boron is ion-implanted at a concentration of, for example, from $1 \times 10^{14}/cm^2$ to $1 \times 10^{16}/cm^2$.

The heavily doped impurity region EX2 has an impurity concentration and a depth greater than those of the lightly doped impurity region EX1. These lightly doped impurity region EX1 and heavily doped impurity region EX2 include a source/drain region having an LDD (Lightly Doped Drain) structure.

The above-described steps substantially complete six transistors (Dr1, Acc1, Lo1, Lo2, Acc2, and Dr2).

Next, a metal silicide layer 13 is formed on the gate electrode G and the source/drain region (EX2) by using salicide (Self Aligned Silicide) technology. When the mask film (not shown) such as silicon nitride film remains on the gate electrode G, silicidation is conducted after removal of this film. For example, a metal film such as nickel (Ni) film is formed on the transistor, followed by heat treatment to cause a silicidation reaction in a contact area between the gate electrode G and the Ni film and between the source/drain region (EX2) and the Ni film. Then, the Ni film which has remained unreacted is removed to form a nickel silicide film.

Next, as shown in FIGS. 34 to 37, first plugs P1 (including P1g, SP1, P1b, and P1w) are formed inside the opening portions OAw and OAb and on the individual transistors (Dr1, Acc1, Lo1, Lo2, Acc2, and Dr2) and then, first to third-level wirings (M1 to M3) are formed thereon.

First, as an interlayer insulating film IL1, a film stack of a silicon nitride film and a silicon oxide film is formed inside the opening portions OAw and OAb and on individual transistors (Dr1, Acc1, Lo1, etc.). Then, a contact hole is made in the interlayer insulating film IL1 and a conductive film is deposited on the interlayer insulating film IL1 including the inside of this contact hole. In forming the contact hole, it is formed inside the opening portions OAb and OAw in the formation regions of the first plugs P1b and P1w. This makes it possible to prevent electrical conduction between the metal film (first plug) to be buried in the contact hole and a region outside the opening portion (semiconductor region 3, back gate region BG, and the like).

As the conductive film, a film stack of a barrier film (not shown) and a metal film can be used. As the barrier film, for example, a Ti (titanium) film or a TiN (titanium nitride) film, or a film stack thereof can be used. As the metal film, for example, a W (tungsten) film can be used. The first plug P1 is formed by removing the conductive film other than that deposited in the contact hole by CMP or the like to fill the contact hole with the conductive film.

Next, a first-level wiring M1 is formed on the plug P1. This first-level wiring M1 can be formed by patterning the conductive film. The first-level wiring M1 may be formed as a buried wiring (damascene wiring).

Next, after formation of an interlayer insulating film IL2 on the first-level wiring M1, a second plug P2 and a second-level wiring M2 are formed. The second plug P2 can be formed in the interlayer insulating film IL2 as in the formation of the first plug P1. The second-level wiring M2 can be formed as in the formation of the first-level wiring M1. This second-level wiring M2 may be formed as a buried wiring. In this case, a so-called dual damascene process, in which the second plug P2 and the second-level wiring M2 are formed simultaneously by filling the contact hole and the wiring trench with a conductive film, may be used.

Next, after formation of an interlayer insulating film IL3 on the second-level wiring M2, a third plug P3 and a third-level wiring M3 are formed. The third plug P3 can be formed in a similar manner to the formation of the first plug P1 in the interlayer insulating film IL3. This third-level wiring M3 may be formed as a buried wiring. At this time, a so-called dual damascene process, in which the third plug P3 and the third-level wiring M3 are formed simultaneously by filling the contact hole and wiring trench simultaneously with a conductive film, may be employed.

No limitation is imposed on the steps of forming patterns including the above cross-sectional structure and they may be interchanged or modified as needed.

Second Embodiment

In the first embodiment, below the semiconductor region 3 in which the n type transistor (Dr1) including a SRAM is placed, the n type back gate region nBG is placed via the insulating layer BOX and therebelow, the p well region Pwell is placed (refer to FIG. 2), but their conductivity type may be inverted.

Described specifically, below the semiconductor region 3 in which the n type transistor is placed, a p type back gate region pBG is placed via an insulating layer BOX and below this p type back gate region pBG, an n well region Nwell is placed.

In this n type transistor, the gate electrode G of this transistor (Dr1) is electrically coupled to the p type back gate region pBG therebelow and the n well region Nwell is fixed at a power supply potential (Vdd).

Also in this case, an advantage similar to that of the first embodiment can be produced. Described specifically, a back gate potential can be dynamically controlled so that it becomes low when the transistor is in an ON state and becomes high when the transistor is in an OFF state. No forward bias is applied between the well region and the back gate region so that a leakage current between them can be reduced.

Furthermore, in this case, the threshold potential (Vth) of the n type transistor increases, which is preferred when the threshold potential (Vth) must be designed to be high. Since the threshold potential (Vth) increases, an OFF-state current can be suppressed.

In the first embodiment, below the semiconductor region 3 in which the p type transistor (Lo1, etc.) including a SRAM is placed, a p type back gate region pBG is placed via an insulating layer BOX and below this p type back gate region pBG, an n well region Nwell is placed (refer to FIG. 4). The conductivity type of them may be inverted.

This means that, below the semiconductor region 3 in which a p type transistor is placed, an n type back gate region nBG is placed via an insulating layer BOX and below this n type back gate region nBG, a p well region Pwell is placed.

In this p type transistor, the gate electrode G of this transistor is electrically coupled to the n type back gate region nBG lying therebelow and in addition, the p well region Pwell is fixed at a grounding potential (VSS).

Also in this case, an advantage similar to that of the first embodiment can be produced. In other words, it is possible to dynamically control the back gate potential so as to make the threshold potential (Vth) lower when the transistor is in an ON state and on the contrary, make the threshold potential higher when the transistor is in an OFF state. In addition, since no forward bias is applied between the well region and the back gate region, a leakage current therebetween can be reduced.

Furthermore, in this case, the threshold potential (Vth) of the n type transistor increases, which is preferred when the threshold potential (Vth) must be designed to be high. Since the threshold potential (Vth) increases, an OFF-state current can be suppressed.

In the present embodiment, the configuration is similar to that of the first embodiment except the conductivity type of the well region and the back gate region is opposite to that in the first embodiment. The detailed description on the configuration is therefore omitted.

Third Embodiment

Figure 38:
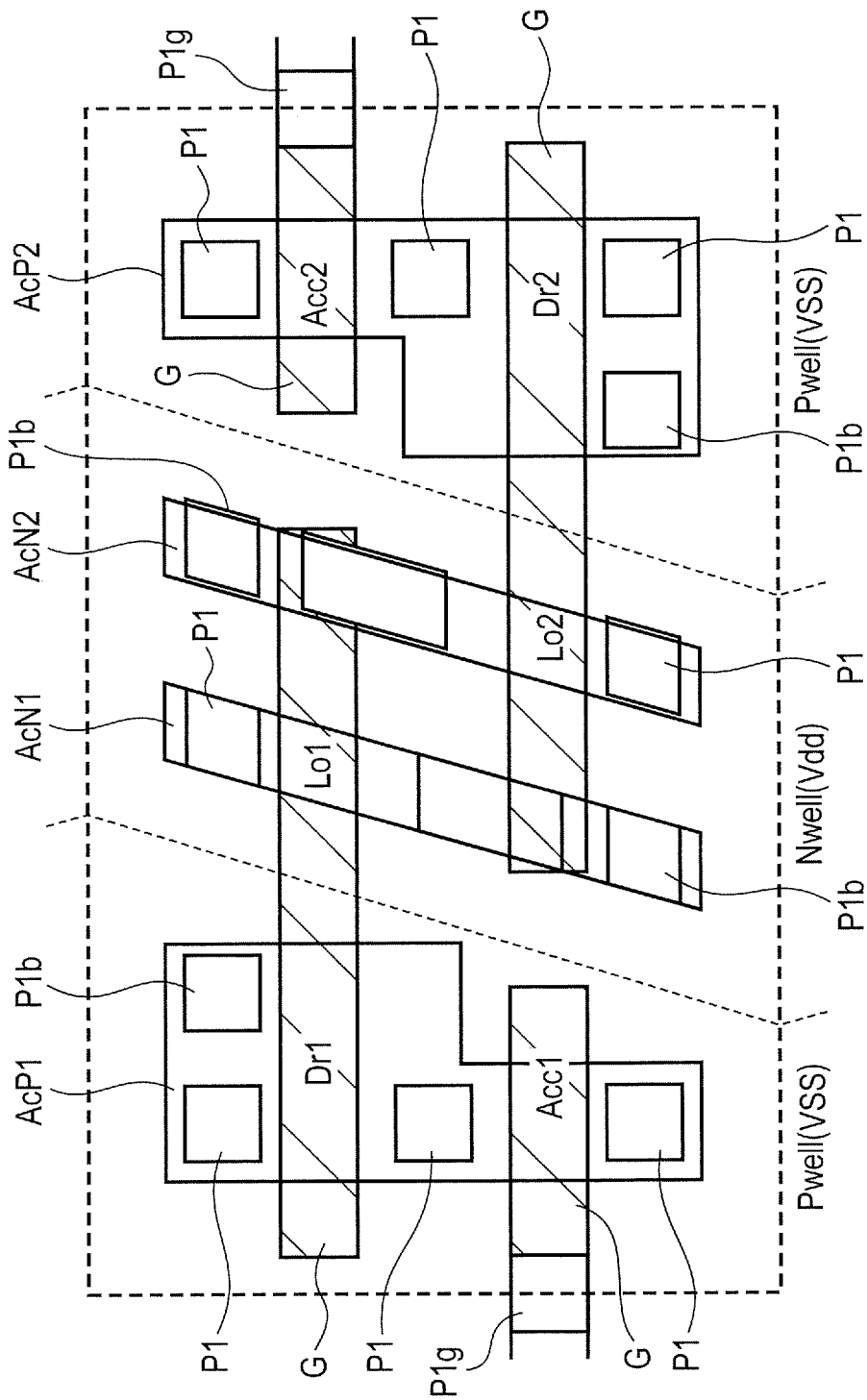
FIG. 38 is a plan view showing the configuration of a SRAM according to the third embodiment.

In the first embodiment, active region (Ac) is trapezoidal (refer to FIG. 10), but it may have another shape. FIG. 38 is a plan vie showing the configuration of the SRAM of this embodiment.

In FIG. 38, the active region AcP1 has a step difference. The arrangement portion of the first plug P1b has an increased width. In other words, the active region AcP1 has a wide portion so that the X-direction width (length) at one Y-direction end is greater than the X-direction width at the other Y-direction end. In FIG. 38, the wide portion is present in the upper portion of the drawing.

The active region AcP2 also has a step difference. The arrangement portion of the first plug P1b has an increased width. In other words, the active region AcP2 has a wide portion so that the X-direction width (length) at one Y-direction end is greater than the X-direction width in the other Y direction end. In FIG. 38, the wide portion is present in the lower portion of the drawing. This means that this region has a wide portion at the end opposite side to the active region AcP1.

In the first embodiment and FIG. 38, in the memory cell region, the n well region Nwell is inclined (parallelogram), but the n well region may have a rectangular shape. By inclining (parallelogram) the n well region to cope with the wide portion (protrusion) of the active region (Ac), the length of the memory, cell region in the X direction decreases, leading to a reduction in the area of the memory cell.

Fourth Embodiment

In the first embodiment, after formation of the opening portions OAb and OAw, the interlayer insulating film IL1 and the first plugs P1b and P1w are formed. Contact holes for the first plugs P1b and P1w may be formed in the interlayer insulating film IL1 without providing the opening portions OAb and OAw. This means that contact holes different in the depth from the well region (well) to the back gate region (BG) may be formed.

Figure 39:
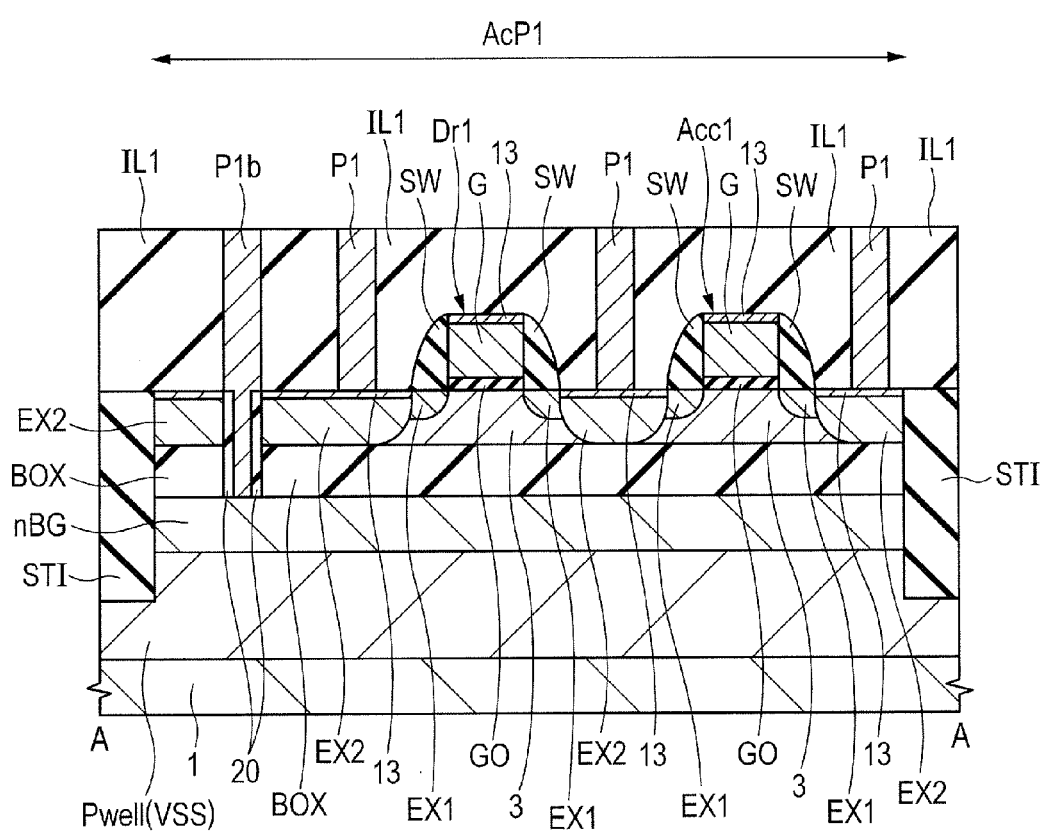
FIG. 39 is a cross-sectional view showing a manufacturing step of a SRAM according to the fourth embodiment.
Figure 40:
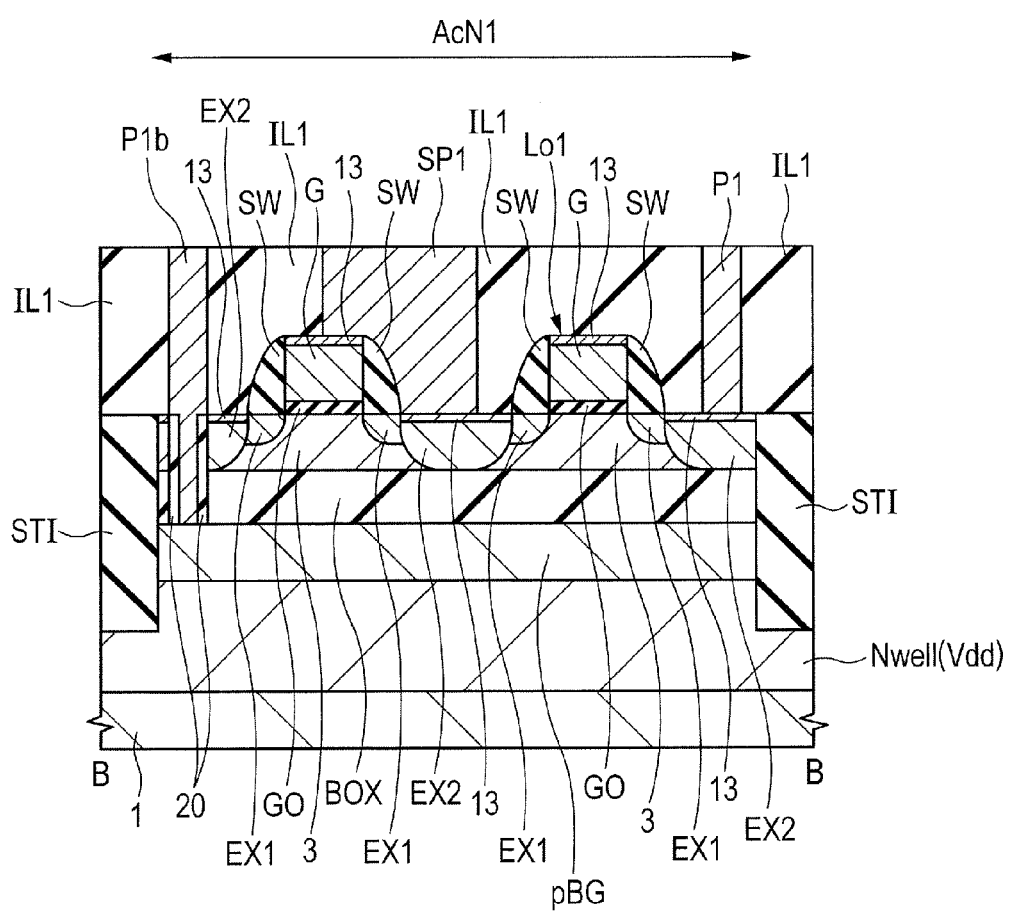
FIG. 40 is a cross-sectional view showing a manufacturing step of a SRAM according to the fourth embodiment.
Figure 41:
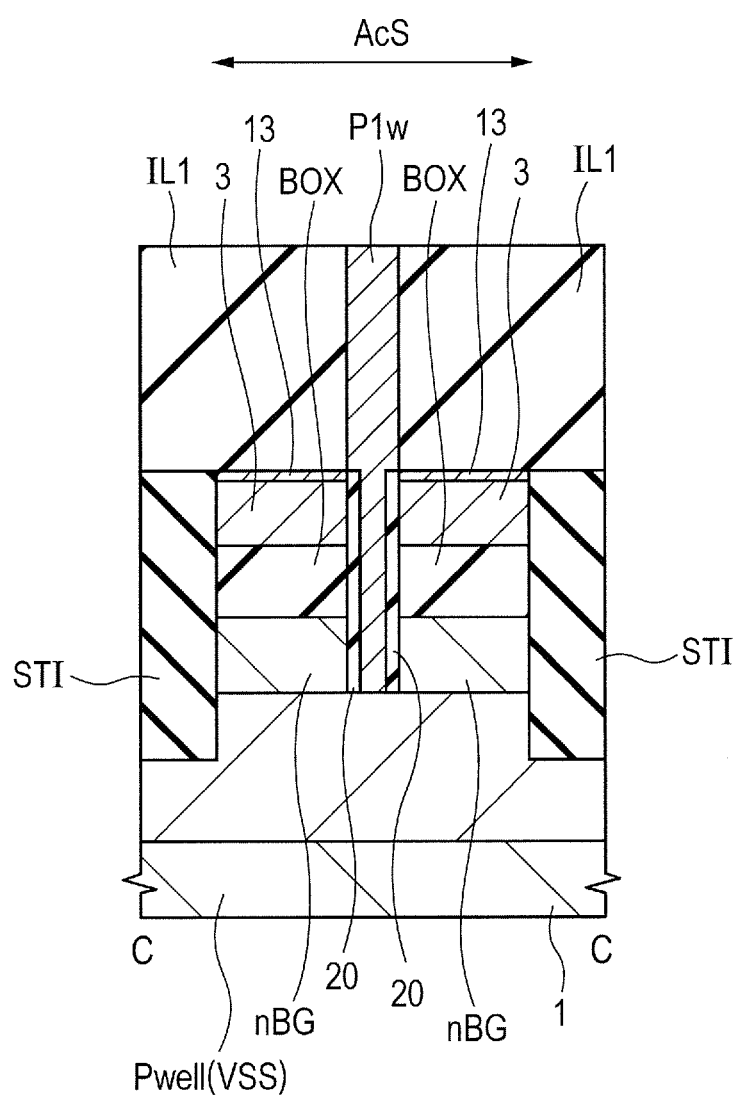
FIG. 41 is a cross-sectional view showing a manufacturing step of a SRAM according to the fourth embodiment.
Figure 42:
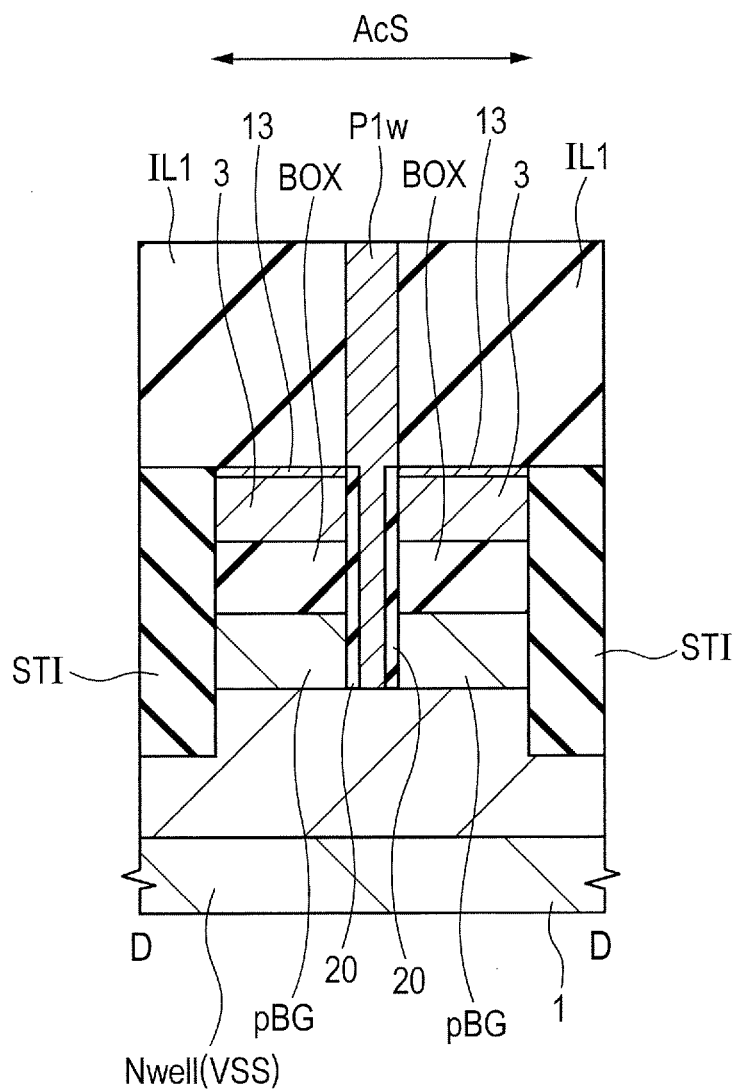
FIG. 42 is a cross-sectional view showing a manufacturing step of a SRAM according to the fourth embodiment.

FIG. 39 to FIG. 42 are cross-sectional views showing manufacturing steps of the SRAM of the present embodiment. FIG. 39 corresponds to, for example, the A-A cross-section of FIG. 10, FIG. 40 corresponds to the B-B cross-section of FIG. 10. FIG. 41 corresponds to, for example, C-C cross-section of FIG. 24 and FIG. 42 corresponds to the D-D cross-section of FIG. 24.

As shown in the drawings, after formation of an element isolation region STI, a back gate region (BG), and a well region (well), individual transistors (Lo1, Lo2, Acc1, Acc2, Dr1, and Dr2) are formed on the semiconductor region 3.

Then, a film stack of a silicon nitride film and a silicon oxide film is formed as an interlayer insulating film IL1 on individual transistors (Dr1, Acc1, Lo1, and the like). Then, a contact hole is made in the interlayer insulating film IL1. When the contact hole is formed, in the formation region of the first plug P1b, not only the interlayer insulating film IL1 but the semiconductor region 3 and the insulating layer BOX lying thereunder are also removed to form a contact hole reaching even the back gate region (pBG or nBG). In the formation region of the first plug P1w of a tap cell, not only the interlayer insulating film IL1 but also the semiconductor region 3, the insulating layer BOX, and the back gate region (pBG or nBG) lying therebelow are removed to form a contact hole reaching even the well region (Nwell or Pwell).

Then, the inside of the contact hole is oxidized to form a silicon oxide film 20 on the side walls and the bottom portion of the contact hole. Anisotropic etching is conducted to remove the silicon oxide film 20 from the bottom portion of the contact hole. By this step, the semiconductor region 3 and the back gate region (pBG or nBG) exposed from the side walls of the contact hole is covered with the silicon oxide film 20. This makes it possible to prevent short-circuit between the first plug P1b or P1w and the semiconductor region 3 or the back gate region BG.

Instead of the silicon oxide film 20 a sidewall film (not shown) may be formed. In this case, the sidewall film is formed on the side wall of the contact hole by depositing an insulating film such as a thin silicon nitride film on the interlayer insulating film IL1 including the inside of the contact hole, followed by anisotropic etching. Also in this case, short-circuit between the conductive film (first plug P1b, P1w) buried in the contact hole with the semiconductor region 3 or the back gate region BG or the like can be prevented.

Fifth Embodiment

In the first embodiment, also in the tap cell region, the conductivity type of the back gate region (BG) and that of the underlying well region (well) are reversed (refer to FIG. 13 and FIG. 14), but they may be the same.

Figure 43:
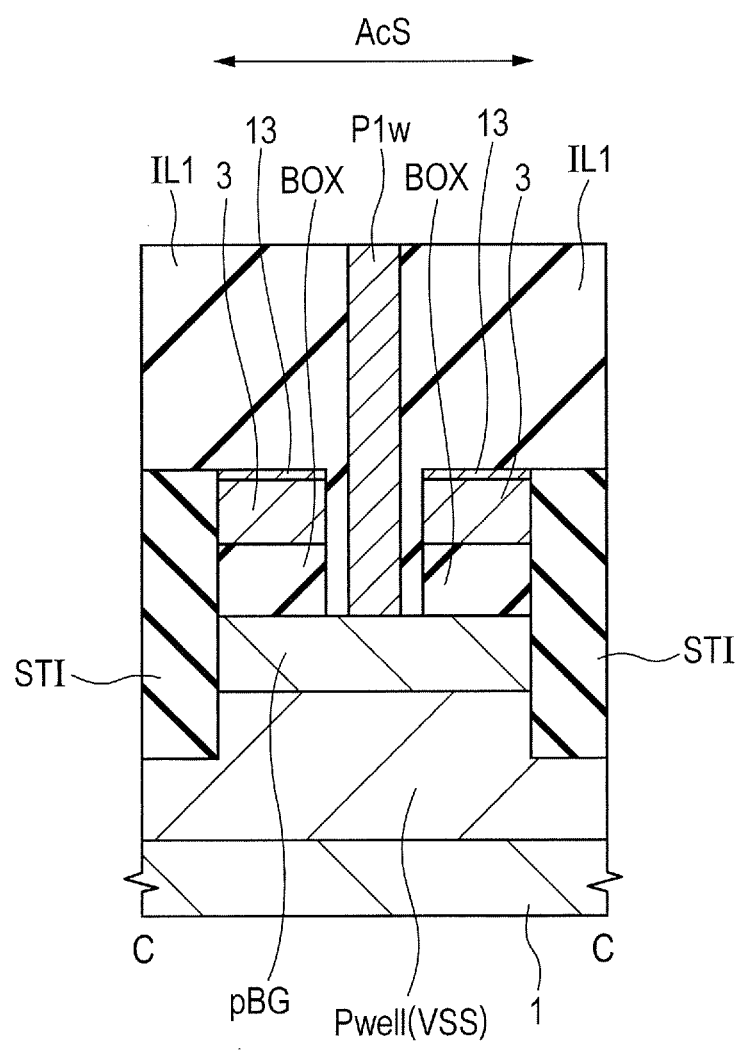
FIG. 43 is a cross-sectional view of a tap cell region of a SRAM according to the fifth embodiment.
Figure 44:
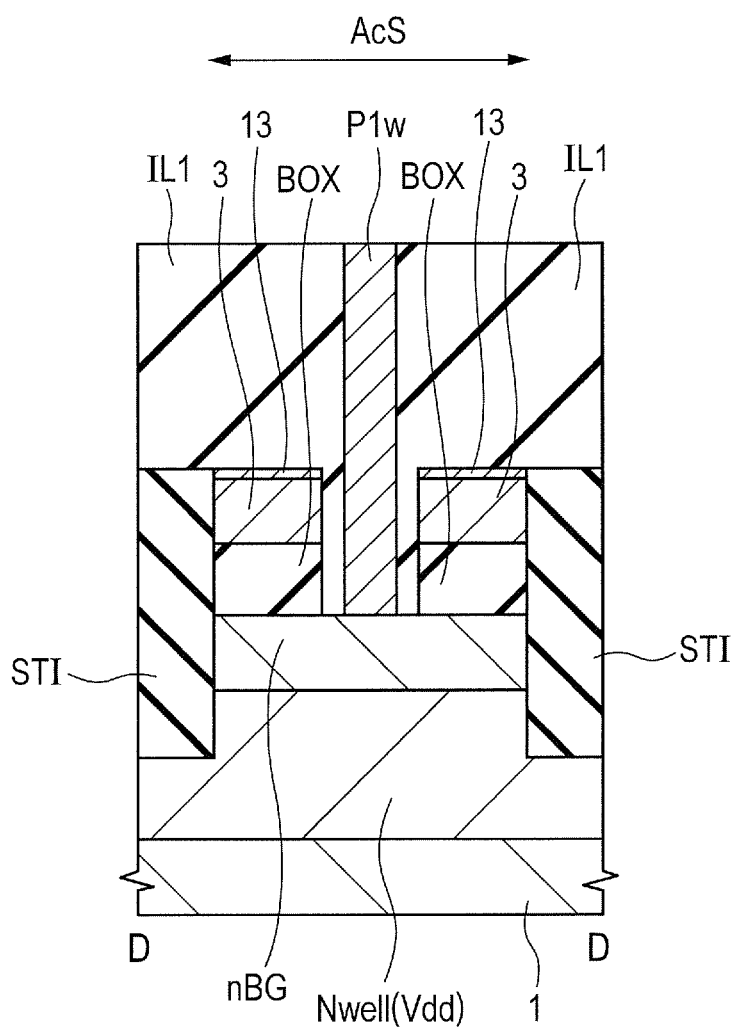
FIG. 44 is a cross-sectional view of the tap cell region of the SRAM according to the fifth embodiment.

FIG. 43 and FIG. 44 are cross-sectional views showing the tap cell region of the SRAM of the present embodiment. FIG. 43 corresponds to, for example, the C-C cross-section of FIG. 24 and FIG. 44 corresponds to the D-D cross-section of FIG. 24.

As shown in FIG. 43, the active region (AcS) has therebelow a p type back gate region pBG via an insulating layer BOX and the p type back gate region has therebelow a p well region Pwell. This p type back gate region pBG may be formed simultaneously with the p type back gate region pBG below the active region AcN1 or AcN2 (refer to FIG. 12).

As shown in FIG. 44, the active region (AcS) has therebelow an n type back gate region nBG via an insulating layer BOX and the n type back gate region has therebelow an n well region Nwell. This n type back gate region nBG may be formed simultaneously with the n type back gate region nBG below the active region AcP1 or AcP2 (refer to FIG. 11).

Thus, in the tap cell, the depth of the first plug P1w (contact hole) can be decreased by placing, on the well region (well), a back gate region (BG) having the same conductivity type. This means that as shown in FIGS. 43 and 44, the first plug P1w may be formed by etching the interlayer insulating film IL1 until the back gate region (BG) is exposed to form a contact hole and fill the contact hole with a conductive film. In this case, the first plug P1w has a depth similar to that of the first plug P1b.

Thus, in the present embodiment, well from the first plug P1w can be performed via the back gate region (BG).

Sixth Embodiment

Although no limitation is imposed on the semiconductor devices (including semiconductor parts and electronic devices) using the SRAM described in detail in the above embodiments, it can be incorporated in, for example, SoC (System-on-a-chip) or a semiconductor chip having a system including a microcomputer. The semiconductor chip has CPU (Central Processing Unit), SRAM, and a logic circuit (LOGIC). The chip may have, as well as SRAM, another memory device such as EEPROM (Electrically Erasable Programmable Read Only Memory) or it may have an analogue circuit.

CPU is also called "central processing unit" and it is the brain of a computer. This CPU reads the order from a memory device, analyzes it, and carries out calculation or control based on it. This CPU has a CPU core (CUPcore) inside and the CPU core has a SRAM inside. As the SRAM in the CPU core, a high-performance SRAM is employed. The SRAM described in detail in the above embodiments is suited. Microcomputer having the SRAM described in the above embodiments incorporated therein can have improved characteristics.

The invention made by the present inventors has so far been described specifically based on some embodiments. It should however be borne in mind that the invention is not limited to or by these embodiment. It is needless to say that various modifications can be given to it without departing from the scope of the invention.

For example, the configurations of the present embodiment can be used after combination as needed. Specific examples include a combination of the configuration of the fourth embodiment (FIGS. 41 and 42) and the configuration of the back gate region (BG, FIGS. 43 and 44) of the fifth embodiment.

Description on the above embodiments has been made using SRAM as an example. As is apparent from FIGS. 2 and 4, the present embodiments can be applied widely to semiconductor devices having a transistor (n channel transistor or p channel transistor).

The invention relates to a semiconductor device, particularly to a semiconductor device having CMOS or SRAM placed on an SOI substrate.

What is claimed is:

1. A semiconductor device comprising:
   (a1) a first transistor coupled between a first potential and a first node;
   (a2) a second transistor coupled between the first node and a second potential lower than the first potential;
   (a3) a third transistor coupled between the first potential and a second node;
   (a4) a fourth transistor coupled between the second node and the second potential;
   (b1) a first active region which is surrounded by an element isolation region and in which the first transistor is located;
   (b2) a second active region which is surrounded by the element isolation region and in which the second transistor is located;
   (c) an insulating layer placed below the first active region and the second active region;
   (d1) a first semiconductor region placed below the first active region via the insulating layer and surrounded by the element isolation region;
   (d2) a second semiconductor region placed below the second active region via the insulating layer and surrounded by the element isolation region;
   (e1) a third semiconductor region placed below the first semiconductor region and at least partially extending to a position deeper than the element isolation region; and
   (e2) a fourth semiconductor region placed below the second semiconductor region and at least partially extending to a position deeper than the element isolation region,
   wherein the first semiconductor region is coupled to the gate electrode of the first transistor,
   wherein the second semiconductor region is coupled to the gate electrode of the second transistor;
   wherein the third semiconductor region is a region having a conductivity type opposite to that of the first semiconductor region and coupled to the first potential, and
   wherein the fourth semiconductor region is a region having a conductivity type opposite to the second semiconductor region and coupled to the second potential.

2. The semiconductor device according to claim 1, further comprising:
   (b3) a third active region which is surrounded by the element isolation region and in which the third transistor is located;
   (b4) a fourth active region which is surrounded by the element isolation region and in which the fourth transistor is located;
   (c2) the third active region and the fourth active region having therebelow the insulating layer;
   (d3) a fifth semiconductor region placed below the third active region via the insulating layer and surrounded by the element isolation region;
   (d4) a sixth semiconductor region placed below the fourth active region via the insulating layer and surrounded by the element isolation region;
   (e3) a seventh semiconductor region placed below the fifth semiconductor region and at least partially extending to a position deeper than the element isolation region; and (e4) an eighth semiconductor region placed below the sixth semiconductor region and at least partially extending to a position deeper than the element isolation region;

wherein the fifth semiconductor region is coupled to the gate electrode of the third transistor;

wherein the sixth semiconductor region is coupled to the gate electrode of the fourth transistor;

wherein the seventh semiconductor region has a conductivity type opposite to that of the fifth semiconductor region and is coupled to the first potential, and wherein the eighth semiconductor region has a conductivity type opposite to that of the sixth semiconductor region and is coupled to the second potential.

3. The semiconductor device according to claim 1, wherein the first semiconductor region contains p type impurities, the second semiconductor region contains n type impurities, the third semiconductor region contains n type impurities, and the fourth semiconductor region contains p type impurities.

4. The semiconductor device according to claim 2, wherein the first semiconductor region and the fifth semiconductor region contain p type impurities, the second semiconductor region and the sixth semiconductor region contain n type impurities, the third semiconductor region and the seventh semiconductor region contain n type impurities, and the fourth semiconductor region and the eighth semiconductor region contain p type impurities.

5. The semiconductor device according to claim 1, wherein the first active region and the second active region are free from p type or n type impurities.

6. The semiconductor device according to claim 2, wherein the first active region, the second active region, the third active region, and the fourth active region are free from p type or n type impurities.

7. The semiconductor device according to claim 2, further comprising:

(a5) a fifth transistor coupled between the first node and a first bit line, and (a6) a sixth transistor coupled between the second node and a second bit line.

8. The semiconductor device according to claim 7, wherein the fifth transistor is placed in the second active region and the sixth transistor is placed in the fourth active region.

9. The semiconductor device according to claim 8, wherein the drive potential of the fifth transistor and the sixth transistor is higher than that of the second transistor and the fourth transistor.

10. The semiconductor device according to claim 9, wherein the first active region, the second active region, the third active region, and the fourth active region are arranged in plan view in a first direction in the order of the second active region, the first active region, the third active region, and the fourth active region.

11. The semiconductor device according to claim 10, wherein the second active region extends in plan view in a second direction intersecting with the first direction, and has a wide portion at one end in the second direction so that a first-direction width at one end in the second direction is greater than a first-direction width at the other end in the second direction.

12. The semiconductor device according to claim 11, wherein the fourth active region extends in plan view in the second direction intersecting with the first direction and has a wide portion at an end portion over a side opposite to the side where the wide portion of the first active region is formed.

13. The semiconductor device according to claim 12, wherein the second active region has, at the wide portion thereof, a first coupling portion reaching the second semiconductor region, and wherein the fourth active region has, at the wide portion thereof, a second coupling portion reaching the sixth semiconductor region.

14. The semiconductor device according to claim 13, wherein the second semiconductor region is coupled to the gate electrode of the second transistor via the first coupling portion, and wherein the sixth semiconductor region is coupled to the gate electrode of the fourth transistor via the second coupling portion.

15. The semiconductor device according to claim 13, wherein the first active region has a third coupling portion reaching the first semiconductor region, and wherein the third active region has a fourth coupling portion reaching the fifth semiconductor region.

16. The semiconductor device according to claim 15, wherein the first semiconductor region is coupled to the gate electrode of the first transistor via the third coupling portion, and wherein the fifth semiconductor region is coupled to the gate electrode of the third transistor via the fourth coupling portion.

17. The semiconductor device according to claim 2, comprising a memory cell array which has a plurality of memory cells having the first to sixth transistors and in which the memory cells are symmetrically arranged in repetition with respect to a line extending in the first direction and symmetrically arranged in repetition with respect to a line extending in the second direction.

18. The semiconductor device according to claim 1, wherein the memory cell array has a first array region having m pieces of memory cells in the first direction and n pieces of memory cells in the second direction and a second array region having m pieces of memory cells in the first direction and n pieces of memory cells in the second direction, wherein the first array region and the second array region have therebetween a power feed region extending in the first direction, wherein in the power feed region, the third semiconductor region is coupled to the first potential and the fourth semiconductor region is coupled to the second potential.

* * * * *